(12) United States Patent
Takemura

(10) Patent No.: US 9,503,087 B2
(45) Date of Patent: Nov. 22, 2016

(54) METHOD OF DRIVING SEMICONDUCTOR DEVICE

(71) Applicant: SEMICONDUCTOR ENERGY LABORATORY CO., LTD., Atsugi-shi, Kanagawa-ken (JP)

(72) Inventor: Yasuhiko Takemura, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/680,203

(22) Filed: Apr. 7, 2015

(65) Prior Publication Data

US 2015/0214945 A1 Jul. 30, 2015

Related U.S. Application Data

(63) Continuation of application No. 13/870,125, filed on Apr. 25, 2013, now Pat. No. 9,007,090.

(30) Foreign Application Priority Data

May 1, 2012 (JP) .................................. 2012-104477

(51) Int. Cl.

| H03K 17/16 | (2006.01) |
|---|---|
| H03K 19/003 | (2006.01) |
| H03K 19/094 | (2006.01) |

(Continued)

(52) U.S. Cl.
CPC ........ *H03K 19/003* (2013.01); *H03K 19/0016* (2013.01); *H03K 19/094* (2013.01); *H03K 19/1776* (2013.01); *H03K 19/17772* (2013.01)

(58) Field of Classification Search
None
See application file for complete search history.

(56) References Cited

U.S. PATENT DOCUMENTS

| 5,731,856 A | 3/1998 | Kim et al. |
|---|---|---|
| 5,744,864 A | 4/1998 | Cillessen et al. |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Anh Tran
(74) *Attorney, Agent, or Firm* — Fish & Richardson P.C.

(57) ABSTRACT

A programming element including a first transistor, a second transistor, and a capacitor between a logic circuit using a semiconductor element and a power supply is provided. In the programming element, a node where a drain electrode of the first transistor, a gate electrode of the second transistor, and one of electrodes of the capacitor are electrically connected to each other is formed. A potential can be supplied to each of a source electrode of the first transistor and the other of the electrodes of the capacitor. The power supply and the logic circuit are electrically connected to each other through a source electrode and a drain electrode of the second transistor. A connection state between the power supply and the logic circuit is controlled in accordance with the state of the second transistor.

21 Claims, 11 Drawing Sheets

(51) Int. Cl.
*H03K 19/00* (2006.01)
*H03K 19/177* (2006.01)

(56) References Cited

U.S. PATENT DOCUMENTS

| | | | |
|---|---|---|---|
| 5,929,686 A | 7/1999 | Itou | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,781,865 B2 | 8/2004 | Ohtsuka et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,046,615 B2 | 10/2011 | Taguchi et al. | |
| 8,339,188 B1 | 12/2012 | Silver et al. | |
| 8,547,753 B2 | 10/2013 | Takemura et al. | |
| 8,760,931 B2 | 6/2014 | Takemura et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0259316 A1* | 10/2010 | Fujita | H03K 19/00361 327/540 |
| 2010/0264956 A1* | 10/2010 | Yin | H01L 21/82380 326/120 |
| 2011/0175646 A1* | 7/2011 | Takemura et al. | 326/44 |
| 2014/0252346 A1 | 9/2014 | Takemura et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-064277 A | 3/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-116851 A | 5/2009 |
| JP | 2011-172214 A | 9/2011 |
| WO | WO-2004/114391 | 12/2004 |
| WO | WO-2011/089808 | 7/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

(56) References Cited

OTHER PUBLICATIONS

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", AM-FPD '09 Digest of Technical Papers, Jul. 1, 2009, pp. 41-44.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFE2O4, and YB2FE3O7 Types of Structures for Compounds in the In2O3 and Sc2O3—A2O3—Bo Systems [A; Fe, Ga, Or Al; B: Mg, Mn, Fe, Ni, Cu,Or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystallie Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTS With a Novel Passivation Layer", SID Digest '09, : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treetment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTS", IDW '09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

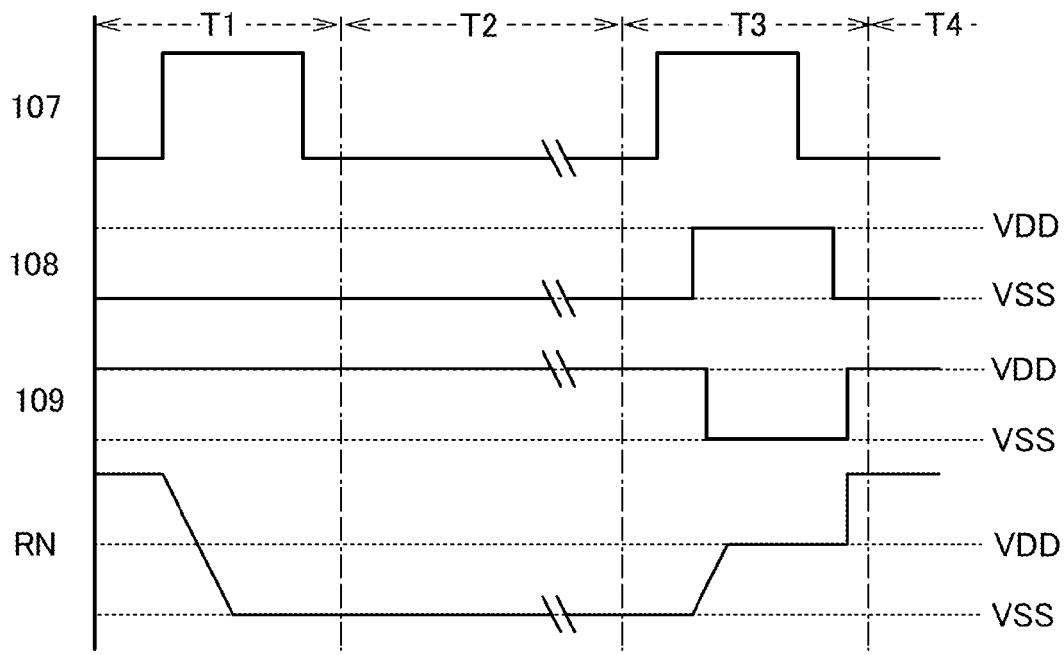
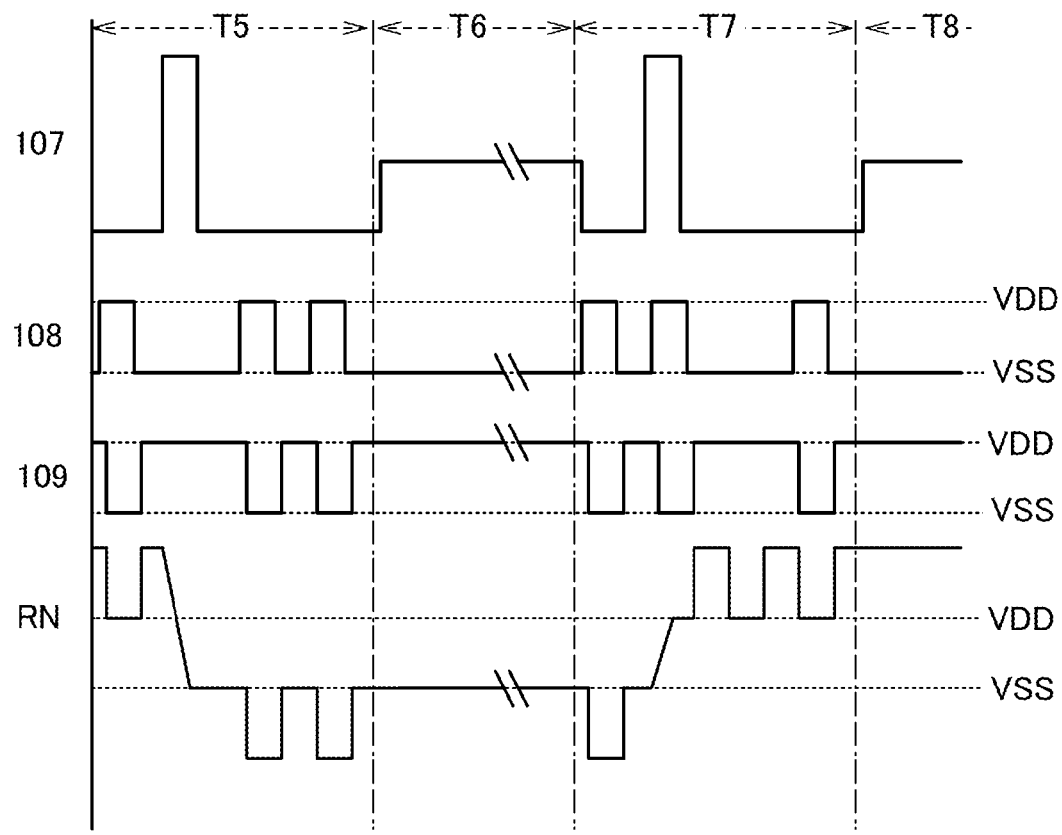

METHOD OF DRIVING SEMICONDUCTOR DEVICE

CROSS-REFERENCE TO RELATED APPLICATIONS

This application is a continuation of U.S. application Ser. No. 13/870,125, filed Apr. 25, 2013, now allowed, which claims the benefit of a foreign priority application filed in Japan as Serial No. 2012-104477 on May 1, 2012, both of which are incorporated by reference.

BACKGROUND OF THE INVENTION

1. Field of the Invention

The present invention relates to a semiconductor device and a method of driving the semiconductor device.

In this specification, a semiconductor device generally means a device which can function by utilizing semiconductor characteristics, and an electrooptic device, a semiconductor circuit, and an electronic device are all semiconductor devices.

The present invention relates to an object, a method, or a manufacturing method. Further, the present invention relates to a process, a machine, manufacture, or a composition of matter. In particular, the present invention relates to, for example, a semiconductor layer, a semiconductor device, a display device, a liquid crystal display device, a light-emitting device, a driving method thereof, or a manufacturing method thereof. In particular, the present invention relates to a semiconductor device including a transistor, a display device, a light-emitting device, or a driving method thereof, for example. Further, the present invention relates to, for example, an electronic device including the semiconductor device, the display device, or the light-emitting device.

2. Description of the Related Art

Signal processing units such as central processing units (CPUs) vary in structure depending on the intended use. Examples of components of a signal processing unit are a logic circuit performing arithmetic processing, a main memory for storing data or a program, a register or a cache memory which temporarily holds data for carrying out arithmetic processing or holding a program execution state, for example, and the like.

In a signal processing unit, a logic circuit performing arithmetic processing does not constantly operate and stops operation at many periods. Power gating is a known technique which attempts at a reduction in electric power by interrupting power supply to a circuit that stops operation at such periods (e.g., see Patent Document 1).

REFERENCE

Patent Document 1: Japanese Published Patent Application No. 2009-116851

SUMMARY OF THE INVENTION

In a semiconductor device performing power gating, a switch controlling electrical connection between a power source and a logic circuit is provided between the power source and the logic circuit so as to be connected in series with the logic circuit. Hence, when the on-state resistance of a transistor (switching transistor) used for the switch is high, a potential input to the logic circuit decreases to be lower than a power supply potential due to a voltage drop or the like, which might prevent supply of a voltage necessary for the logic circuit.

Therefore, the on-state resistance of the switching transistor is required to be sufficiently low. In order to reduce the on-state resistance of the switching transistor, for example, a potential supplied to a gate electrode of the switching transistor should be high when the switching transistor is an n-channel switching transistor.

If the off-state resistance of the switching transistor is not sufficiently high, standby current increases and a reduction in power consumption is suppressed, in which case the off-state resistance of the switching transistor is required to be sufficiently high. In such a case, for example, when the switching transistor is a p-channel switching transistor, a potential supplied to the gate electrode of the switching transistor should be high.

However, such operation allows a large change in the potential of the gate electrode. Thus, a problem is a large change in the potential supplied to the switching transistor.

In view of the above, an object of a semiconductor device of one embodiment of the present invention is to suppress a drop of a voltage supplied to a gate electrode of a transistor used for power gating. Another object is to reduce power consumption of the semiconductor device.

Another object of the present invention is to provide a highly reliable semiconductor device or the like. Another object is to provide a semiconductor device with high yield or the like. Another object is to provide a novel semiconductor device or the like.

Note that the descriptions of these objects do not preclude the existence of other objects. Note also that one embodiment of the present invention does not necessarily achieve all the objects listed above. Other objects will be apparent from and can be derived from the description of the specification, the drawings, the claims, and the like.

A programming element including a first transistor, a second transistor, and a capacitor between a logic circuit using a semiconductor element and a power source is provided. In the programming element, a node where a drain electrode of the first transistor, a gate electrode of the second transistor, and one of electrodes of the capacitor are electrically connected to each other is formed. A potential can be supplied to each of a source electrode of the first transistor and the other of the electrodes of the capacitor. The power source and the logic circuit are electrically connected to each other through a source electrode and a drain electrode of the second transistor. A connection state between the power source and the logic circuit is controlled in accordance with the state of the second transistor.

Thus, one embodiment of the present invention is a method of driving a semiconductor device including a logic circuit, a programming element, and a power source, the programming element including a first transistor, a second transistor, a capacitor, and a node where a drain electrode of the first transistor, a gate electrode of the second transistor, and one of electrodes of the capacitor are electrically connected to each other. The method includes the steps of: supplying electric power to the logic circuit from the power source through the second transistor; stopping a power supply potential to the logic circuit from the power source by turning off the second transistor by supplying a potential capable of turning off the second transistor to the node in accordance with a stop of an operation of the logic circuit; placing the node into a floating state when the logic circuit returns to operation; and resuming supply of the power supply potential to the logic circuit from the power source by making a potential of the node in the floating state a potential capable of turning on the second transistor using capacitive coupling between the node and the other of the electrodes of the capacitor.

Another embodiment is a method of driving a semiconductor device including a logic circuit, a programming element, and a power source, the programming element including a first transistor, a second transistor, a capacitor, and a node where a drain electrode of the first transistor, a gate electrode of the second transistor, and one of electrodes of the capacitor are electrically connected to each other. The method includes the steps of: supplying electric power to the logic circuit from the power source through the second transistor; stopping a power supply potential to the logic circuit from the power source by turning off the second transistor by supplying a potential capable of turning off the second transistor to the node in accordance with a stop of an operation of the logic circuit; holding a potential of the gate electrode of the second transistor in the node by turning off the first transistor in a period in which the electric power supply to the logic circuit from the power source is stopped; supplying a first potential to the node by turning on the first transistor when the logic circuit returns to the operation; supplying a second potential to the other of the electrodes of the capacitor; placing the node into a floating state by turning off the first transistor; turning on the second transistor by supplying a third potential to the other of the electrodes of the capacitor and making a potential of the node a potential capable of turning on the second transistor using capacitive coupling between the node and the other of the electrodes of the capacitor; electrically connecting the power source and the logic circuit due to the second transistor that is turned on; and holding the potential of the node and an on state of the second transistor by turning off the first transistor.

In the above, the second transistor may be an n-channel transistor or a p-channel transistor. When the second transistor is an n-channel transistor, the on-state resistance of the second transistor can be sufficiently reduced. When the second transistor is a p-channel transistor, the off-state resistance of the second transistor can be sufficiently reduced.

When a semiconductor having a large band gap such as an oxide semiconductor is used as a semiconductor layer of the first transistor, the off-state current or leakage current of the first transistor is reduced. Therefore, the on/off of the second transistor can be held even when operation of the logic circuit is interrupted or the first transistor is turned off during the operation.

The first potential and the third potential may be equal potentials. When the first potential and the third potential are equal potentials, potentials needed to be formed in a circuit are reduced, so that power consumption can be reduced. Note that the third potential is preferably higher than the first potential.

Note that the expression "equal potentials" means that the potentials are not particularly potentials obtained by intentionally changing the voltage with the use of a circuit for changing a voltage such as a voltage converter. Thus, the equal potentials are substantially equal potentials and not necessarily exactly equal potentials. The potentials are regarded as equal even with such a difference that a problem does not occur in practical use, for example, a difference of ±5%. Therefore, even when an input potential becomes different from the potential that is exactly equal to the input potential by undergoing a voltage drop due to wiring resistance or the like, these potentials are here assumed to be equal potentials.

In addition, as the second potential, a potential complementary to the first potential may be input.

The term complementary potentials can be described as follows. In the case where the potentials of two signal lines can be two potentials, a high potential and a low potential, the potential of one signal line is a high potential when the potential of the other signal line is a low potential, or the potential of one signal line is a low potential when the potential of the other signal line is a high potential, in which case the potential of the other signal line is defined as a potential complementary to the potential of one signal line. Note that complementary potentials do not necessarily indicate a comparison between the levels of the potentials of two signal lines. For example, potentials exhibiting opposite phases such as a potential input to an inverter circuit and a potential output therefrom are also complementary potentials.

According to one embodiment of the present invention, a drop of a voltage supplied to a logic circuit used for power gating can be suppressed. In addition, power consumption of the semiconductor device can be reduced.

BRIEF DESCRIPTION OF THE DRAWINGS

In the accompanying drawings:

FIGS. 2A and 2B are timing charts each illustrating a method of driving a semiconductor device of one embodiment of the present invention;

DETAILED DESCRIPTION OF THE INVENTION

Figure 1A:
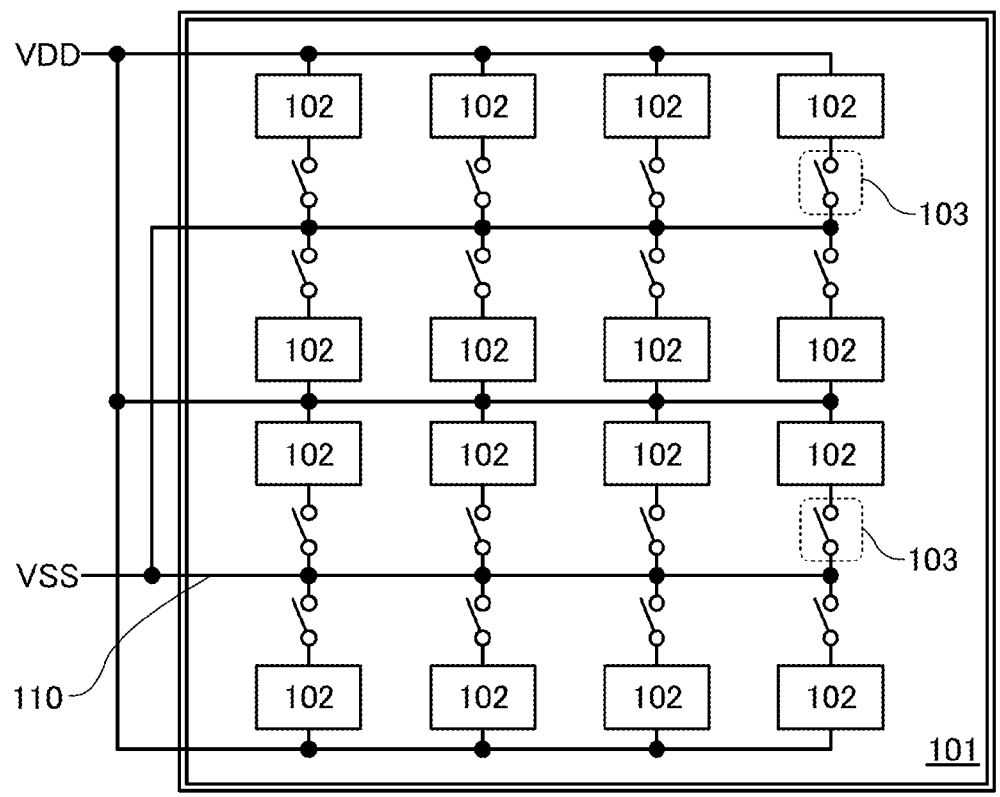
FIGS. 1A and 1B are a block diagram and a circuit diagram, respectively, of a semiconductor device of one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

In embodiments hereinafter described, the same components may be denoted by the same reference numerals throughout the drawings. The thickness, width, relative relation of position, and the like of components illustrated in the drawings may be exaggerated for clarification of description of the embodiments.

Note that the term such as "over" in this specification and the like does not necessarily mean that a component is placed "directly on" another component. For example, the expression "a gate electrode layer over an insulating film" can mean the case where there is an additional component between the insulating film and the gate electrode layer. The same applies to the term "below".

In this specification and the like, the term "electrode layer" or "wiring layer" does not limit the function of components. For example, an "electrode layer" can be used as part of a "wiring layer", and the "wiring layer" can be used as part of the "electrode layer". In addition, the term "electrode layer" or "wiring layer" can also mean a combination of a plurality of "electrode layers" and "wiring layers", for example.

Regarding the expression for explaining a circuit, a gate electrode, a source electrode, and a drain electrode of a transistor can also be referred to as, for example, a gate (terminal), a source (terminal), and a drain (terminal), respectively. Therefore, a transistor according to one embodiment of the present invention is not limited to a transistor including a gate electrode, a source electrode, and a drain electrode.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are an electrode, a wiring, and the like.

Even when only one transistor is illustrated in the drawings, the transistor may be provided as two or more transistors connected in series or in parallel. The same applies to a capacitor or other elements.

Embodiment 1

In this embodiment, a semiconductor device and a method of driving the semiconductor device according to one embodiment of the present invention are described with reference to drawings.

FIG. 1A illustrates a semiconductor device 101 of one embodiment of the present invention. The semiconductor device 101 of one embodiment of the present invention includes a plurality of (preferably greater than or equal to 10, more preferably greater than or equal to 100) logic circuits 102 arranged in a matrix. The logic circuits 102 are each electrically connected to a high potential power source and a low potential power source. The logic circuits 102 are electrically connected to the low potential power source through a low potential power supply line 110. A programming element 103 is provided between the low potential power supply line 110 and the logic circuit 102 so as to be connected in series with the logic circuit 102. The programming element 103 controls connection states between the logic circuit 102 and the low potential power source.

In FIG. 1A, without distinction, all the logic circuits arranged in a matrix are referred to as the logic circuits 102. However, the logic circuits 102 may have different circuit configurations. Alternatively, the logic circuits 102 may have the same circuit configurations. In addition, the logic circuits 102 are not necessarily regularly arranged in a matrix as illustrated in FIG. 1A and may be dispersed; the same applies to the programming elements 103.

As already described, the programming element 103 controls electrical connection between the logic circuit 102 and the low potential power source. By turning on the programming element 103, a potential is supplied from the low potential power source to the logic circuit 102. By turning off the programming element 103, supply of a potential from the low potential power source to the logic circuit 102 is interrupted.

By controlling the programming element 103, electric power supply to the logic circuit 102 that stops operation is interrupted, and electric power supply is resumed when the logic circuit 102 returns to operation. Electric power supply to the logic circuit 102 is interrupted during the period in which the operation is stopped, and accordingly, power consumption of the semiconductor device 101 can be reduced. Frequent control of electric power supply to the logic circuits enables both lower power consumption and more efficient arithmetic processing in the semiconductor device illustrated in FIG. 1A.

Details of the programming element 103 are described with reference to FIG. 1B.

The programming element 103 includes a first transistor 104, a second transistor 105, and a capacitor 106. A gate electrode of the first transistor 104 is electrically connected to a selection signal line 107, and a selection signal is input to the gate electrode. By the selection signal, the first transistor 104 is turned on or off. A drain electrode of the first transistor, a gate electrode of the second transistor 105, and one of electrodes of the capacitor 106 are electrically connected to each other and form a node. This node is particularly referred to as a storage node (or a node RN).

The potential of a first wiring 108 is input to the node via a source electrode of the first transistor 104. By the selection signal input through the selection signal line 107, the first transistor 104 is turned on or off to control the connection between the node and the first wiring 108.

The first transistor 104 is a transistor including a semiconductor material in a channel formation region, which has a large band gap (e.g., about three times as large as that of silicon). Accordingly, the off-state current or leakage current of the transistor is extremely reduced. By turning off the first transistor 104, the node to which the drain electrode of the first transistor 104 is electrically connected is capable of holding charge for a long time.

Examples of the semiconductor material having a large band gap are an oxide semiconductor, silicon carbide, gallium nitride, and the like. Note that an oxide semiconductor is detailed in a later embodiment. Note also that a material of the first transistor 104 is not limited to an oxide semiconductor and may be amorphous silicon, polycrystalline silicon, or single crystal silicon.

The first transistor 104 is not required to be operated at high speed such as clock frequency of an arithmetic circuit and therefore can have a field-effect mobility of 1 cm$^2$/Vs or more or may have an on-state resistance of 10$^8$Ω or less.

The off-state resistance of the first transistor 104 is determined by the capacitance of the capacitor 106 and a period in which charge is held in the node RN. For example, the capacitance of the capacitor 106 is set to the same value (30 fF) as that used in a dynamic random access memory (DRAM) and the first transistor 104 is formed using silicon having low off-state resistance as in a DRAM; consequently, charge is lost within one second. Even with the same capacitance, when the first transistor 104 is formed using an oxide semiconductor whose off-state resistance is higher by about eight orders of magnitude (and whose off-state resistance is 1×10$^{22}$Ω or more), charge can be held for ten years or more.

The off-state resistance can also be increased by extending the channel. For example, by increasing the channel length to 100 times as long as that of a general transistor, the period in which charge can be held can be increased one hundred-fold. Since the first transistor 104 is not required to perform high-speed operation as described above, the extension of the channel creates few problems.

A transistor having such a long channel requires a large area but, when the first transistor 104 is a thin film transistor, a substantial increase in area is prevented because the first transistor 104 can be stacked over the second transistor 105 (which usually requires a large area due to its very wide channel). When the first transistor 104 is a thin film transistor, the off-state resistance can also be increased by reducing the thickness of a semiconductor layer.

As long as electric power supplied to the logic circuits is on or off at intervals of 0.1 millisecond to 10 milliseconds, for example, 1 millisecond, no problem arises even when the period in which charge can be held is 1 second (e.g., even when silicon is used for the first transistor).

The other of the electrodes of the capacitor 106 is electrically connected to a second wiring 109.

A source electrode and a drain electrode of the second transistor 105 are electrically connected to the low potential power supply line 110 and the logic circuit 102, respectively. The low potential power supply line 110 is electrically connected to the low potential power source. Thus, by turning on or off the second transistor 105, connection between the logic circuit 102 and the low potential power supply line 110 can be controlled. In this embodiment, when the second transistor 105 is turned on and the logic circuit 102 and the low potential power supply line 110 are electrically connected to each other, the programming element 103 is assumed to be on. Further, when the second transistor 105 is turned off and the logic circuit 102 and the low potential power supply line 110 are disconnected, the programming element 103 is assumed to be off.

The second transistor 105 is provided between the low potential power source and the logic circuit 102 so as to be connected in series with the logic circuit 102, and hence the on-state resistance of the second transistor 105 is preferably low. Therefore the field-effect mobility of the second transistor 105 is set greater than or equal to 100 cm$^2$/Vs, more preferably greater than or equal to 300 cm$^2$/Vs.

In addition, a capacitance $C_{106}$ of the capacitor 106 is larger than a gate capacitance $C_{105}$ of the second transistor 105, preferably five or more times, more preferably ten or more times as large as the gate capacitance $C_{105}$.

A method of driving the semiconductor device 101 of one embodiment of the present invention is described. Note that the first transistor 104 and the second transistor 105 are re-channel transistors in the following description but this does not limit the present invention.

FIG. 2A is a timing chart illustrating the case where the programming element 103 is driven. In FIG. 2A, the reference numerals 107, 108, and 109 denote a potential input to the selection signal line 107, a potential input to the first wiring 108, and a potential input to the second wiring 109, respectively. The symbol RN denotes the potential of the node RN where the drain electrode of the first transistor 104, the gate electrode of the second transistor 105, and the one of electrodes of the capacitor 106 are electrically connected to each other.

Here, the semiconductor device 101 is driven in the following order: the period (T1 illustrated in FIG. 2A) in which, in conjunction with a stop of the operation of the logic circuit 102, the programming element 103 is turned off and electric power supply to the logic circuit 102 is interrupted; the period (T2 illustrated in FIG. 2A) in which the state of interrupting electric power supply is held; the period (T3 illustrated in FIG. 2A) in which, in conjunction with a return of the operation of the logic circuit 102, the programming element 103 is turned on and electric power supply to the logic circuit 102 is resumed; and the period (T4 illustrated in FIG. 2A) in which the state of supplying electric power is held.

To begin with, a driving method in the period (T1) in which the programming element 103 is turned off and electric power supply to the logic circuit 102 is interrupted is described.

To turn off the programming element 103, a potential that turns on the first transistor 104 is supplied to the selection signal line 107.

In this embodiment, to turn on the first transistor 104, the potential of the selection signal line 107 is set to an appropriate high potential. In other words, a potential exceeding the sum of a potential later supplied to the first wiring 108 and the threshold voltage Vth$_{104}$ of the first transistor 104 can be input.

Here, the potential of the first wiring 108 is set to a potential that turns off the second transistor 105.

When the first transistor 104 is turned on, the potential of the first wiring 108 is input to the node RN. Although the potential of the node RN is a potential high enough to turn on the second transistor 105 until just before the first transistor 104 is turned on, when the first transistor 104 is turned on, the potential of the node RN decreases by the input of the potential of the first wiring 108 to the node RN. Thus, the potential that turns off the second transistor 105 is input to the node RN, so that the second transistor 105 is turned off.

Further, a low potential (VSS) is input to the source electrode of the second transistor 105 through the low potential power supply line 110. Therefore, in order to turn off the second transistor 105, the potential of the first wiring 108 can be set to VSS+Vth$_{105}$ (the threshold voltage of the second transistor) or less and the potential of the gate electrode of the second transistor 105 can be set to VSS+Vth$_{105}$ or less.

Here, a low potential (VSS) is supplied to the first wiring 108.

A low potential (VSS) is input through the first wiring 108 to the gate electrode of the second transistor 105, so that the second transistor 105 is turned off. By turning off the second transistor 105, the electrical connection between the logic circuit 102 and the low potential power supply line 110 is cut, and electric power supply to the logic circuit 102 is interrupted.

In the period (T1) in which the programming element 103 is turned off and electric power supply to the logic circuit 102 is interrupted, the potential of the second wiring 109 is set to a high potential (VDD). After that, the potential of the selection signal line 107 is set lower than the threshold voltage $Vth_{104}$ of the first transistor 104, so that the first transistor 104 is turned off.

Note that when the first transistor 104 is turned off, parasitic capacitance between the gate and the drain (node RN) reduces the potential of the node RN. However, in the following description, it is assumed that there is no parasitic capacitance between the gate and the drain.

To this point, the programming element 103 is turned off, and electric power supply to the logic circuit 102 is interrupted. Then, the period (T2) in which the state of interrupting electric power supply is held is described.

At any timing in the period (T2) in which the state of interrupting electric power supply is held, the first transistor 104 is turned on, and operation similar to that in the period in which electric power supply is interrupted may be performed. By such operation, the off state of the second transistor 105 can be kept.

Note that when an oxide semiconductor is used for the first transistor 104, its off-state current or leakage current is extremely low (its off-state resistance is extremely high), and accordingly, the potential of the node RN can be held for a long period.

Thus, it becomes unnecessary to control the first transistor 104 in the period (T2) and power consumption can further be reduced.

In the period (T2) in which the state of interrupting electric power supply is held, the second wiring 109 is preferably kept at a high potential (VDD).

Then, a driving method in the period (T3 illustrated in FIG. 2A) in which, in conjunction with a return of the operation of the logic circuit 102, the programming element 103 is turned on and electric power supply to the logic circuit 102 is resumed is described.

To turn on the programming element 103, the potential of the selection signal line 107 is first set to a potential that turns on the first transistor 104. The potential input here can be a potential exceeding the sum of a potential later supplied to the first wiring 108 and the threshold voltage $Vth_{104}$ of the first transistor 104.

When the first transistor 104 is turned on, the potential of the first wiring 108 is input to the node RN. Here, a high potential (VDD) is input through the first wiring 108.

At this time, the second wiring 109 is set to a low potential (VSS). Accordingly. a voltage (VDD-VSS) is applied to the capacitor 106.

Then, the potential of the selection signal line 107 is reduced, and the first transistor 104 is turned off. By turning off the first transistor 104, electrical connection between the first wiring 108 and the node RN is cut, and the node RN is placed into a floating state.

Then, the potential of the second wiring 109 is set to a high potential (VDD). By the increase in the potential of the second wiring 109 from a low potential (VSS) to a high potential (VDD), the potential of the node RN also increases because of capacitive coupling of the capacitor 106.

Since the capacitor 106 has held the voltage (VDD-VSS), the capacitive coupling causes the increase in the potential of the node RN. In particular, when the capacitance $C_{106}$ of the capacitor 106 is sufficiently larger than the capacitance of $C_{105}$ of the second transistor 105, the potential of the node RN exceeds each of the potential supplied to the first wiring 108 and the potential supplied to the second wiring 109. Ideally, the potential of the node RN becomes (2VDD−VSS), and the difference between it and the potential of the low potential power supply line 110 (whose potential is VSS) becomes [2×(VDD−VSS)].

Hence, the capacitance $C_{106}$ is larger than the gate capacitance $C_{105}$, preferably five or more times, more preferably ten or more times as large as the gate capacitance $C_{105}$. When the capacitance $C_{106}$ is equal to the gate capacitance $C_{105}$, ideally, the potential of the node RN becomes {[(3VDD)−VSS]/2}, and the difference between it and the potential of the low potential power supply line 110 becomes [1.5×(VDD−VSS)].

As above, in spite of the fact that the potentials of the first wiring 108 and the second wiring 109 change by only (VDD−VSS), a potential higher than VDD can be supplied to the gate electrode of the second transistor 105 so that the potential can change from VSS at the minimum to [(2× VDD)−VSS] at the maximum. Since the potential supplied to the gate electrode of the second transistor 105 can be increased, the on-state resistance of the second transistor can be reduced.

For example, in the case where the gate capacitance $C_{105}$ at the time when the second transistor 105 is on is equal to the capacitance $C_{106}$ of the capacitor 106, the threshold voltage $Vth_{105}$ of the second transistor 105 is +0.5 V, VSS is 0 V, and VDD is +1 V, the potential of the node RN is increased to +1.5 V by controlling the potential of the second wiring 109. Consequently, the resistance is halved as compared with the case where the potential of the second wiring 109 is not controlled (where the potential of the node RN is +1 V). This means that, even when the channel width of the second transistor 105 is halved, the on-state characteristic obtained is the same. That is, this is effective in reducing the area of the second transistor 105.

Furthermore, changes in the potentials of the first wiring 108 and the second wiring 109 may be smaller than a change in the potential of the node RN, and accordingly, power consumption can be reduced.

Further, a smaller change in the potential of the first wiring 108 leads to a smaller change in the potential of the source electrode of the first transistor 104. Accordingly, it is possible to reduce a change in the potential that is input to the selection signal line 107 to turn on the first transistor 104.

After that, the period T4 (illustrated in FIG. 2A) in which the state of supplying electric power is held starts. By repeating such operations, power supply to the logic circuit 102 or interruption of power supply is possible.

In the above-described example, the potential of the second wiring 109 is set to VSS when the potential of the first wiring 108 is VDD, and the potential of the second wiring 109 is set to VDD when the potential of the first wiring 108 is VSS. However, such a combination does not limit the present invention.

For example, the potential of the second wiring 109 may be set to VSS1 when the potential of the first wiring 108 is VDD, and the potential of the second wiring 109 may be VDD1 when the potential of the first wiring 108 is VSS. Here, the relation between VSS1 and VDD1 is as follows: VSS1<VDD1. The relation between VSS and VSS1 and the relation between VDD and VDD1 may be determined as appropriate as long as the relations satisfy conditions necessary for VDD1 and VSS1.

In addition, the potential of the first wiring 108 is not limited to VDD or VSS and may be other potentials.

Specifically, the potential of the second wiring 109 is set to VSS1 when the potential of the first wiring 108 is VDD2, and the potential of the second wiring 109 is set to VDD1 when the potential of the first wiring 108 is VSS2. Here, the following relations are satisfied: VSS1<VDD1, and VSS2<VDD2. However, the relation between VSS1 and VSS2 and the relation between VDD1 and VDD2 may be determined as appropriate as long as the relations satisfy conditions necessary for VDD2 and VSS2.

For example, when VDD2 is +1 V, VDD1 may be 0 V or +2 V. Similarly, when VSS2 is 0V, VSS1 may be −1 V or +1 V.

Note that when the logic circuits 102 are provided in a matrix as illustrated in FIG. 1A, it is difficult to program the programming elements 103 provided in the logic circuits 102 at the same time (to input a potential necessary to turn on or off the second transistors 105, to the nodes RN of the programming elements 103). Hence, after one of the programming elements 103 is programmed, another programming element 103 is programmed.

In that case, the first wiring 108 and the second wiring 109 are shared among the plurality of programming elements 103. In other words, after one of the programming elements 103 is programmed, the potential of the second wiring 109 may be set to VSS or VDD so that another programming element 103 is programmed Hence, the potential of the node RN of the programming element 103 that finishes being programmed might greatly change.

A timing chart assuming the above case is illustrated in FIG. 2B. The timing chart in FIG. 2B illustrates the period (T5) of a first program, the period (T7) of a second program, the period (T6) between the period (T5) and the period (T7), and the period (T8) after the period (T7) of the second program.

In the period (T5) of the first program, a program for turning off the programming element 103 is performed. However, before and after that, programs for turning on or off another programming element 103 are performed. Accordingly, the potential of the second wiring 109 changes, and the potential of the node RN of the programming element 103 also changes by the capacitive coupling of the capacitor 106.

For example, as illustrated in the period (T5) in FIG. 2B, the potential of the node RN becomes VDD or a value more than VDD before the programming element 103 is programmed (i.e., the programming element 103 is on).

Here, while the potential of the node RN changes as described above, the second transistor 105 of the programming element 103 can be kept on or off. Before the programming element 103 is programmed, the second transistor 105 is on if (VDD−VSS) is the threshold voltage $Vth_{105}$ or more. Thus, the second transistor 105 can be kept on and electric power supply to the logic circuit 102 is not interrupted; therefore the logic circuit 102 is capable of operation also in this period.

Note that in the case where the potential of the node RN is VDD, the on-state resistance of the second transistor 105 is not sufficiently low and accordingly a voltage drop is increased. For example, in the case where the threshold voltage $Vth_{105}$ of the second transistor 105 is +0.5 V, VSS is 0 V, VDD is +1 V, and the maximum voltage drop (which occurs when the assumed maximum current flows) of the second transistor 105 is 10 mV at the time when the potential of the node RN is +2 V, the voltage drop becomes 30 mV if the potential of the node RN becomes VDD (=+1 V). In other words, the voltage applied to the logic circuit changes within 20 mV.

However, the change range is actually smaller because the capacitance of the logic circuit 102 is very large and the time required for programming of the programming element 103 is extremely short.

After the programming element 103 is programmed (the programming element 103 is turned off), the potential of the node RN becomes VSS or less.

The potential of the node RN is preferably less than VSS, in which case the off-state resistance of the second transistor 105 is increased and accordingly standby current can be reduced.

However, when the potential of the node RN is less than VSS, the potential of the selection signal line 107 also needs to be reduced so as not to turn on the first transistor 104. In this case, the potential of the selection signal line 107 can be temporarily generated by a known means. Once the period (T5) of the first program is finished, the potential of the second wiring 109 does not change and therefore the potential of the node RN does not become less than VSS. Hence, in the period (T6) after the period (T5) of the first program, the potential of the selection signal line 107 can be increased.

The same applies to the operations in the period (T7) of the second program and the subsequent period (T8).

Figure 3A:
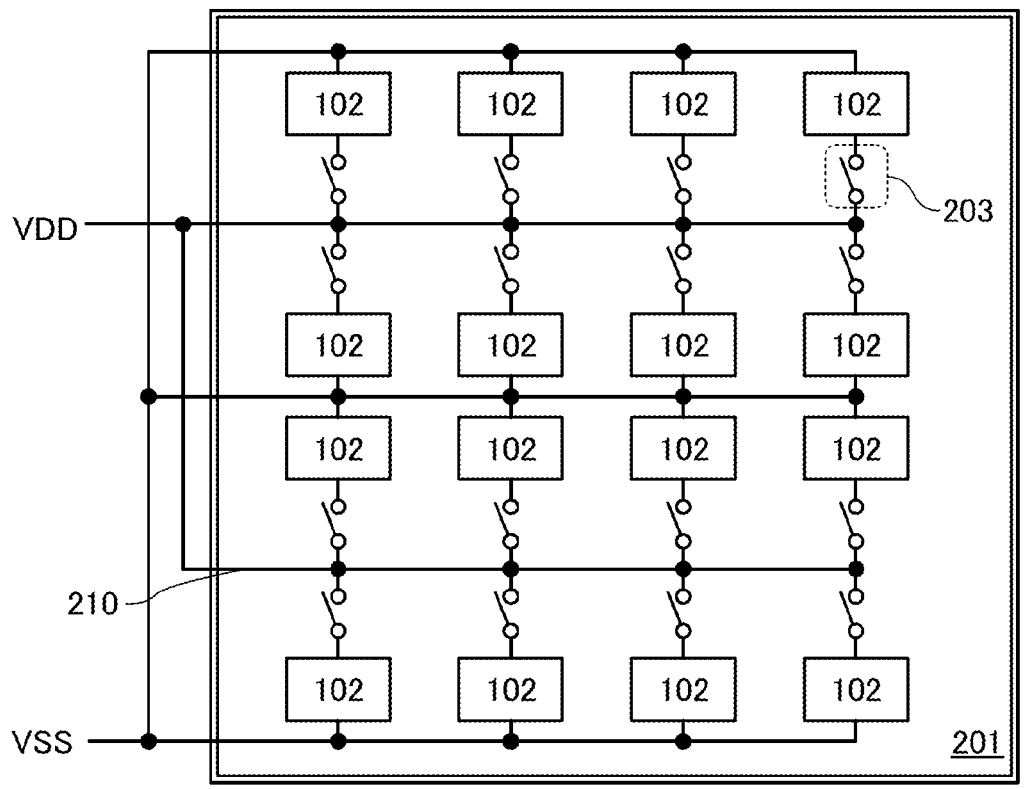
FIGS. 3A and 3B are a block diagram and a circuit diagram, respectively, of a semiconductor device of one embodiment of the present invention.
Figure 3B:
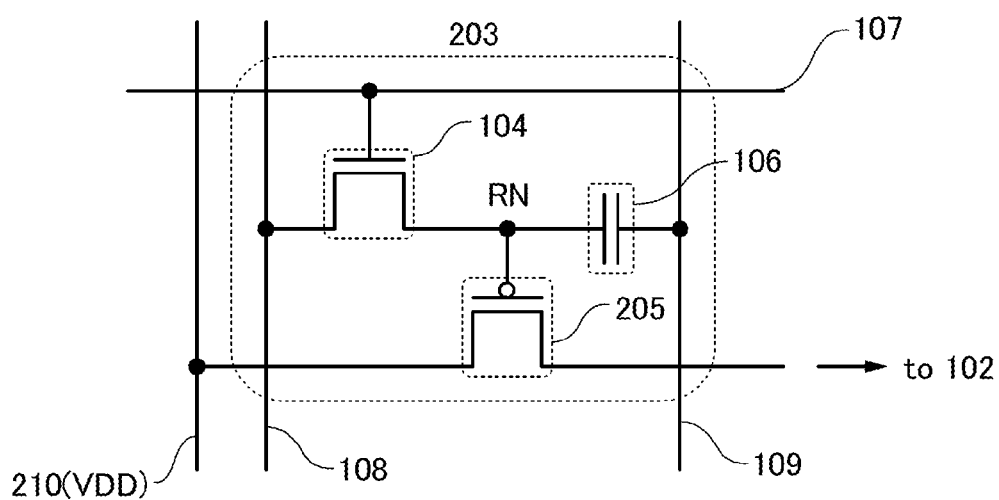

Although an n-channel transistor is used as the second transistor 105, when a p-channel transistor is used, a programming element 203 is preferably provided between the high potential power source and the logic circuit 102 as in a semiconductor device 201 illustrated in FIG. 3A. FIG. 3B illustrates details of the programming element 203.

Figure 1B:
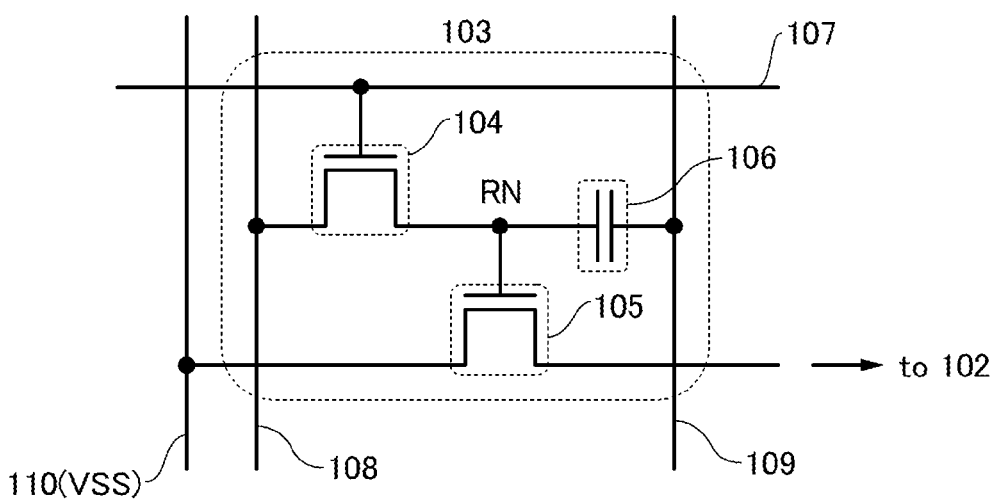

The programming element 203 illustrated in FIGS. 3A and 3B is different from the programming element 103 illustrated in FIGS. 1A and 1B in that, for example, a second transistor 205 which is a p-channel transistor is used instead of the second transistor 105 which is an re-channel transistor.

In a p-channel transistor, a source electrode is on the high potential side and a drain electrode is on the low potential side. Therefore, when the second transistor 205 is a p-channel transistor, the programming element 203 is preferably interposed between the high potential power source and the logic circuit 102 as illustrated in FIGS. 3A and 3B.

An operation of the programming element 203 illustrated in FIG. 3B is described below. Here, explanation is made in the following order: the period (T9) in which, in conjunction with a stop of the operation of the logic circuit 102, the programming element 203 is turned off and electric power supply to the logic circuit 102 is interrupted; the period (T10) in which the state of interrupting electric power supply is held; the period (T11) in which, in conjunction with a return of the operation of the logic circuit 102, the programming element 203 is turned on and electric power supply to the logic circuit 102 is resumed; and the period (T12) in which the state of supplying electric power is held.

To begin with, a driving method in the period (T9) in which the programming element 203 is turned off and electric power supply to the logic circuit 102 is interrupted is described.

To turn off the programming element 203, the potential of the selection signal line 107 is set to a potential that turns on the first transistor 104. For example, a potential exceeding the sum of a potential later supplied to the first wiring 108 and the threshold voltage $Vth_{104}$ of the first transistor 104 can be input.

When the first transistor 104 is turned on, the potential of the first wiring 108 is input to the node RN. Here, a potential that turns off the second transistor 205 is supplied to the first wiring 108.

Although the potential of the node RN is a low potential for turning on the second transistor 205 until just before the first transistor 104 is turned on, when the first transistor 104 is turned on, the potential of the node RN increases by the input of the potential of the first wiring 108 to the node RN. Thus, the potential of the node RN becomes a potential that turns off the second transistor 205, so that the second transistor 205 is turned off.

Further, a high potential (VDD) is input to the source electrode of the second transistor 205 through a high potential power supply line 210. Therefore, in order to turn off the second transistor 205, the potential of the first wiring 108 is set to VDD+Vth$_{205}$ (the threshold voltage of the second transistor) or more and the potential of the gate electrode of the second transistor 205 can be set to VDD+Vth$_{205}$ or more.

Here, a high potential (VDD) is input to the first wiring 108. At this time, the potential of the second wiring 109 is set to a low potential (VSS).

After that, the first transistor 104 is turned off. Further, the potential of the second wiring 109 is set to a high potential (VDD). Consequently, the potential of the node RN becomes a potential higher than VDD. Since the second transistor 205 is a p-channel transistor and therefore it is off when the potential of the node RN becomes VDD, ideally, its gate capacitance can be ignored. Hence, by the increase in the potential of the second wiring 109 from VSS to VDD, ideally, this increase becomes equal to the increase in the potential of the node RN and can be (2VDD−VSS) at the maximum.

Accordingly, the off-state resistance of the second transistor 205 becomes extremely high, and standby current can be significantly reduced. Note that the capacitance $C_{106}$ of the capacitor 106 is preferably greater than or equal to a gate capacitance $C_{105}$ obtained when the second transistor 205 is on. Actually, the increase in potential may be smaller than (VDD−VSS) because the node RN has some capacitance.

To this point, the programming element 203 is turned off, and electric power supply to the logic circuit 102 is interrupted. Then, the period (T10) in which the state of interrupting electric power supply is held is described. In the period (T10) in which the state of interrupting electric power supply is held, the second wiring 109 is preferably kept at a high potential (VDD).

When an oxide semiconductor is used for the first transistor 104, its off-state current or leakage current is extremely low (its off-state resistance is extremely high), and accordingly, the potential of the node RN can be held for a long period.

By holding the potential of the node RN for a long period, the state where the second transistor 205 is off, that is, the programming element 203 is off, can be held for a long period.

Note that in the period (T10) in which the state of interrupting electric power supply is held, the above operation performed in the period (T9) in which the programming element 203 is turned off and electric power supply to the logic circuit 102 is interrupted may be performed again.

In the period (T10) in which the state of interrupting electric power supply is held, the second wiring 109 is preferably kept at a high potential (VDD).

Then, a driving method in the period (T11) in which, in conjunction with a return of the operation of the logic circuit 102, the programming element 203 is turned on and electric power supply to the logic circuit 102 is resumed is described.

To turn on the programming element 203, the potential of the selection signal line 107 is first set to a potential that turns on the first transistor 104. The potential input here can be a potential exceeding the sum of a potential later supplied to the first wiring 108 and the threshold voltage Vth$_{104}$ of the first transistor 104.

When the first transistor 104 is turned on, the potential of the first wiring 108 is input to the node RN. Here, a low potential (VSS) is input through the first wiring 108. At this time, the second wiring 109 is set to a high potential (VDD).

Then, the potential of the selection signal line 107 is reduced, and the first transistor 104 is turned off. By turning off the first transistor 104, electrical connection between the first wiring 108 and the node RN is cut, and the node RN is placed into a floating state. Note that the second wiring 109 is kept at a high potential (VDD). Since the potential of the node RN is a low potential, the second transistor is on, and the state of supplying power to the logic circuit 102 can be held.

After that, the period (T12) in which the state of supplying electric power is held starts. By repeating such operations, power supply to the logic circuit 102 or interruption of power supply is possible.

As above, in spite of the fact that the potentials of the first wiring 108 and the second wiring 109 change by only (VDD−VSS), a potential higher than VDD can be supplied to the gate electrode of the second transistor 205. Since the potential supplied to the gate electrode of the second transistor 205 can be increased, the off-state resistance of the second transistor 205 can be extremely increased.

For example, when the threshold voltage Vth$_{205}$ of the second transistor 205 is −0.5 V, VSS is 0 V, and VDD is +1 V, the potential of the node RN is increased to +2 V by controlling the potential of the second wiring 109. Ideally, the off-state resistance can be increased by even ten or more orders of magnitude at the maximum as compared with the case where the potential of the second wiring 109 is not controlled.

In the case of a transistor including silicon, the off-state resistance is actually increased by only about five orders of magnitude (the off-state resistance is about $1 \times 10^{12} \Omega$ when the transistor has a channel length of 100 nm and a channel width that is 300 times as long as the channel length); nevertheless, standby current can be greatly reduced. Note that in the case where an n-channel transistor whose threshold voltage is +0.5 V and channel length is 100 nm (the channel length should be about 50 times in order to obtain an on-state characteristic equivalent to the that of the second transistor 205) is used as the second transistor 105 of the programming element 103 in FIG. 1B and driven as illustrated in FIG. 2A, the off-state resistance is only about several tens of megaohms.

As the second transistor 205, a p-channel transistor having a high threshold voltage may be used. For example, when the threshold voltage Vth$_{205}$ of the second transistor 205 is 0 V, the on-state resistance (at the time when the potential of the gate is 0 V) is reduced by five or more orders of magnitude as compared with a transistor having a threshold voltage of −0.5 V. However, the off-state resistance (at the time when the potential of the gate is +2 V) hardly changes. That is, the channel width of the second transistor 205 can be reduced.

The semiconductor device described in this embodiment is not limited to the above structure.

In FIG. 1B, in order to change the on/off of another programming element 103 in the same row (i.e., sharing the selection signal line 107), the potential of the selection signal line 107 needs to be controlled to turn on the first transistor 104 of the programming element 103 whose on/off needs to be changed, and consequently, even the first transistor 104 of the programming element 103 whose on/off does not need to be changed.

In this case, it becomes impossible to maintain the state of the programming element 103 whose on/off does not need to be changed unless the potential of the first wiring 108 is appropriate. Therefore, the potential of the first wiring 108 (and the potential of the second wiring 109) needs to become a potential that allows the programming element 103 whose on/off does not need to be changed to be in an appropriate state (on or off). Thus, the on/off of the programming element whose on/off does not need to be changed is required to be stored in some way.

Figure 4A:
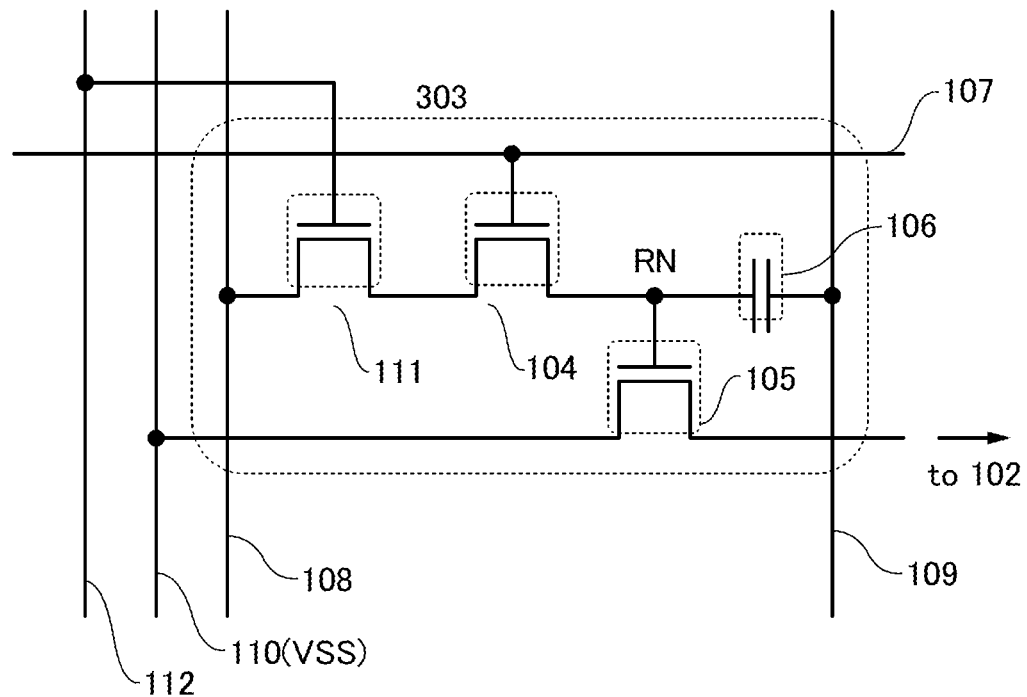
FIGS. 4A and 4B are circuit diagrams each illustrating a semiconductor device of one embodiment of the present invention.

To solve this problem, for example, a programming element 303 has a structure in which a third transistor 111 is interposed between the source electrode of the first transistor 104 and the first wiring 108 as illustrated in FIG. 4A. A source electrode of the third transistor 111 is electrically connected to the first wiring 108, and a drain electrode of the third transistor 111 is electrically connected to the source electrode of the first transistor 104.

A gate electrode of the third transistor 111 is electrically connected to a third wiring 112, and the third transistor 111 is controlled by a potential supplied through the third wiring 112. By the third transistor 111, the on/off of only specific one of the programming elements 303 arranged in a matrix can be controlled.

Figure 4B:
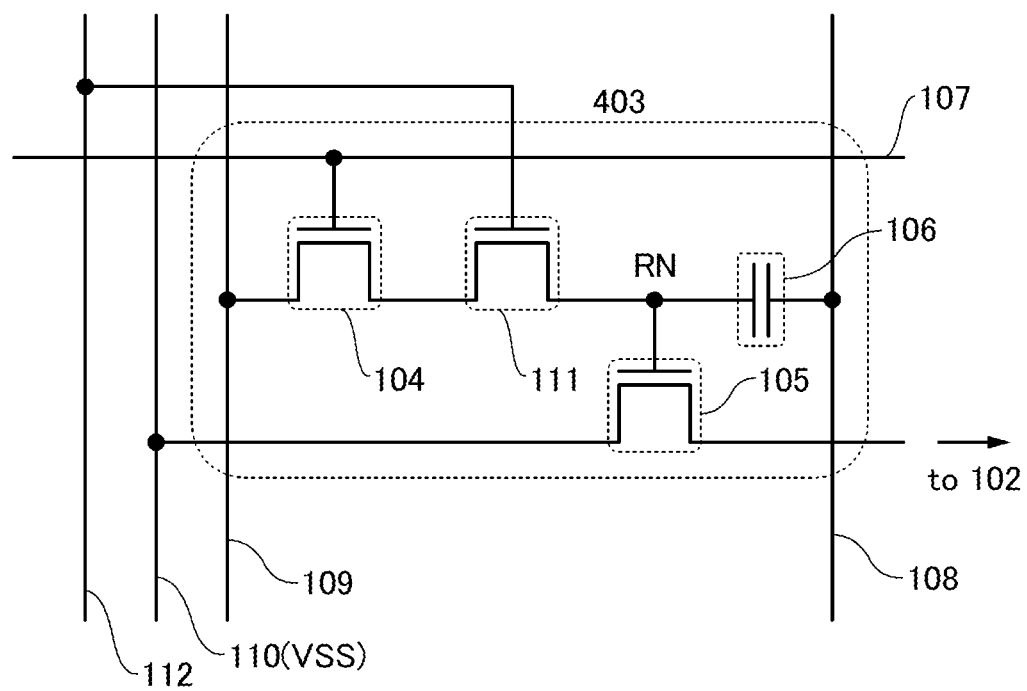

As in a programming element 403 illustrated in FIG. 4B, the third transistor 111 may be formed between the first transistor 104, the second transistor 105, and the capacitor 106. It is preferable in circuits illustrated in FIGS. 4A and 4B that the gate capacitance of the first transistor 104 and the gate capacitance of the third transistor 111 be each sufficiently less than the capacitance of the capacitor 106, and specifically less than or equal to one tenth of the capacitance of the capacitor 106, preferably less than or equal to one fiftieth of the capacitance of the capacitor 106.

Without the third transistor illustrated in FIGS. 4A and 4B, the on/off of the first transistor 104 can be maintained by setting the potentials of the first wiring 108 and the second wiring 109 to appropriate potentials. In this case, the state of the on/off of the programming element 103 might be damaged temporarily, but this does not mean the state of the on/off of the programming element 103 is lost. An operation in such a case is described below using the programming element 103 illustrated in FIG. 1B as an example.

For example, the case where the programming element 103 is turned off is discussed. In order to do that, for example, the first transistor 104 is first turned on, and the potential of the first wiring 108 and the potential of the second wiring 109 are set to VSS and VDD, respectively; then, the first transistor 104 is turned off. After that, the second wiring 109 is kept at VDD. In the case where the capacitance $C_{106}$ of the capacitor 106 is sufficiently larger than the gate capacitance $C_{105}$ of the second transistor 105, the potential of the node RN becomes VSS.

After a time, the following situation is assumed: while the on/off of the programming element 103 does not need to be changed, the on/off of another programming element 103 in the same row needs to be changed. In this case, before the potential of the selection signal line 107 is set to $V_H$, the potentials of the first wiring 108 and the second wiring 109 are each preferably increased to exceed ($V_H$–$Vth_{104}$). Here, $V_H$ refers to a potential applied to the selection signal line 107 to turn on the first transistor 104.

By setting the potential of the second wiring 109 higher than ($V_H$–$Vth_{104}$), the potential of the node RN becomes higher than (VSS+$V_H$–$Vth_{104}$) because of the capacitive coupling of the capacitor 106. Here, the potentials of the first wiring 108 and the second wiring 109 are each assumed to be set to ($V_H$–$Vth_{104}$+α). At this time, the potential of the node RN may be a potential that turns on the second transistor 105.

However, in this state, the first transistor 104 of the programming element 103 whose on/off does not need to be changed is not turned on even when the potential of the selection signal line 107 is set to $V_H$.

In the first transistor 104 of the programming element 103 whose on/off does not need to be changed, the potential of the source (first wiring 108) is ($Y_H$–$Vth_{104}$+α) and the potential of the drain (node RN) is (VSS+$V_H$–$Vth_{104}$+α). In addition, the potential of the gate (selection signal line 107) is $V_H$.

When VSS is greater than or equal to 0 V, the potential of the source is less than or equal to the potential of the drain, and the potential of the gate is lower than the potential of the source by ($Vth_{104}$–α). When α is greater than or equal to +0.5 V, preferably greater than or equal to +1 V, the first transistor 104 remains off.

When VSS is less than 0 V, the potential of the source is higher than the potential of the drain, and the potential of the gate is lower than the potential of the drain by ($Vth_{104}$–VSS–α). When (VSS+α) is greater than or equal to +0.5 V, preferably greater than or equal to +1 V, the first transistor 104 remains off.

For example, when VDD=+1 V, VSS=0 V, $Vth_{104}$=+1 V, $Vth_{105}$=+0.5 V, and $V_H$=+2 V, the potentials of the first wiring 108 and the second wiring 109 can each be set to +2 V. At this time, the potential of the node RN increases from 0 V to +2 V. Consequently, the second transistor 105 is turned on.

The first transistor 104 can be kept sufficiently off because the potentials of its source and drain (node RN) are +2 V, the potential of its gate is +2 V, and a difference between the potentials of the gate and the source is lower than $Vth_{104}$ by as much as 1 V.

After programming of the other programming element 103 is finished, the potentials of the first wiring 108 and the second wiring 109 return into the previous state, and consequently the programming element 103 whose on/off does not need to be changed is also turned off.

In the above driving method, the potentials of the first wiring 108 and the second wiring 109 can be determined regardless of the on/off of the programming element 103 which does not need to be changed. This means that it is unnecessary to read out or store the state of the on/off of the programming element 103 whose on/off does not need to be changed.

When the programming element illustrated in FIG. 1B, FIG. 3B, and FIGS. 4A and 4B is programmed by matrix driving, the potential of the node RN changes in accordance with the change in the potential of the second wiring 109 and becomes lower than VSS as illustrated in FIG. 2B; accordingly, the potential of the gate of the first transistor 104 (i.e., the selection signal line 107) needs to be reduced in accordance with the change in the potential of the node RN.

Figure 5A:
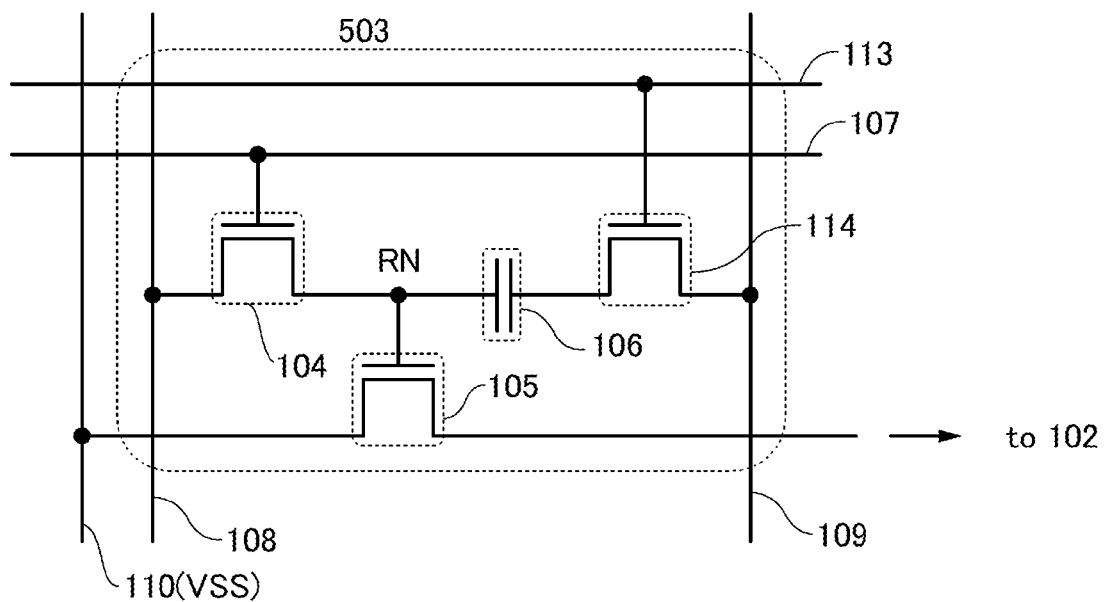
FIGS. 5A and 5B are circuit diagrams each illustrating a semiconductor device of one embodiment of the present invention.

To avoid the above, as in a programming element 503 illustrated in FIG. 5A, a fourth transistor 114 controlled by a second selection signal line 113 is preferably interposed between the capacitor 106 and the second wiring 109. The capacitive coupling between the node RN and the second wiring 109 can be cut by turning off the fourth transistor 114 as necessary; thus, the potential of the node RN can be maintained as appropriate.

The programming element 503 illustrated in FIG. 5A can be driven as follows. First, in order to turn on or off the programming element 503, the first transistor 104 and the fourth transistor 114 are turned on. The potential of the first wiring 108 and the potential of the second wiring 109 are set to complementary potentials, and here, one is referred to as VDD while the other is referred to as VSS. Thus, the potential of the node RN becomes VDD or VSS.

After that, the first transistor 104 and the fourth transistor 114 are turned off. Thus, programming of the programming element 503 is finished. After that, the potential of the second wiring 109 changes because another programming element 503 is programmed. However, since the fourth transistor 114 is off, the change in the potential of the node RN is suppressed.

The change in the potential of the node RN depends on the gate capacitance at the time when the second transistor 105 is off (when the potential of the node RN is VSS), the capacitance of the capacitor 106, the capacitance between the source and the drain at the time when the fourth transistor 114 is off, and the capacitance between the node RN and the other wirings.

In consideration of the sizes of the transistors (e.g., the second transistor 105 larger than the fourth transistor 114), the gate capacitance at the time when the second transistor 105 is off (when the potential of the node RN is VSS) is sufficiently larger than the capacitance between the source and the drain at the time when the fourth transistor 114 is off. Hence, the change in the potential of the node RN is sufficiently smaller than the change in the potential of the second wiring 109 (VDD−VSS).

Note that in the case where the capacitance between the source and the drain at the time when the fourth transistor 114 is off is significantly small, the potential of the node RN is unstable and therefore another capacitor or the like may be provided in parallel with the fourth transistor 114.

In the programming element 103 illustrated in FIG. 1A, the off-state resistance of the second transistor 105 is required to be sufficiently high to reduce standby current, and therefore the threshold voltage $Vth_{105}$ of the second transistor 105 (n-channel transistor) may be increased. However, in this case, the on-state resistance is also increased.

For example, when VSS=0 V, VDD=+1 V, and the potential of the node RN is +1.5 V, the case where the threshold voltage $Vth_{105}$ of the second transistor 105 is +1 V is preferable to the case where the threshold voltage $Vth_{105}$ is +0.5 V in order to reduce standby current because the off-state resistance is higher in the former case by five or more orders of magnitude than in the latter case. However, in the former case, the on-state resistance is also twice as high as that in the latter case and a voltage drop in the on state is twice as high as that in the latter case.

Figure 5B:
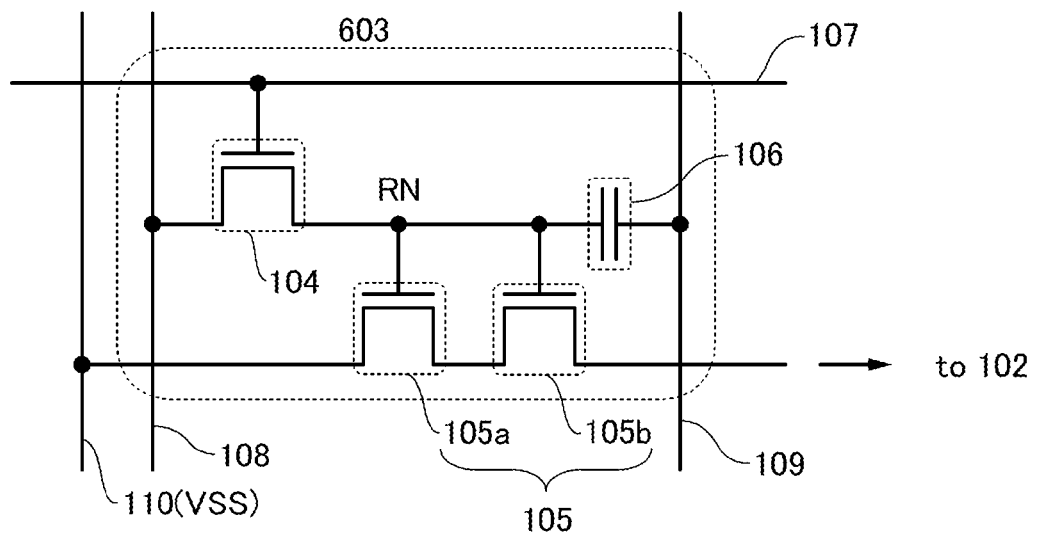

In view of the above, as in a programming element 603 illustrated in FIG. 5B, a transistor 105a and a transistor 105b connected in series may be used instead of the second transistor 105. In this case, when the programming element 603 is turned off (when the potential of the node RN is VSS), the potential of a node between the transistor 105a and the transistor 105b exceeds VSS, and accordingly the potential of a gate of the transistor 105b becomes lower than the potential of its source or drain. Consequently, the off-state resistance can be increased by two or more orders of magnitude with the two transistors which each have a channel length L and are connected in series as compared with one transistor which has a channel length L, for example.

By the way, when such programming elements are dispersed over a chip, the first wiring 108 and the second wiring 109 for connecting the programming elements are long and wiring resistance is increased accordingly. The increase in wiring resistance causes a problem such as an increase in power consumption. In view of the above, the first wiring 108 and the second wiring 109 may be electrically connected to each other via an inverter circuit 115 as in a composite programming element 703 illustrated in FIGS. 6A to 6C.

Figure 6A:
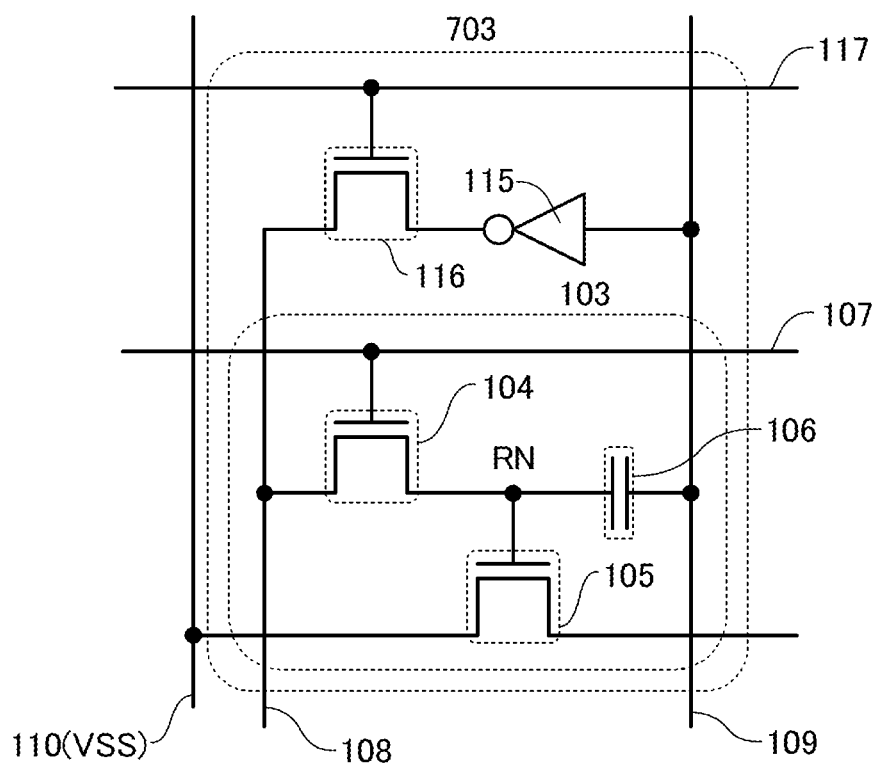
FIGS. 6A to 6C are circuit diagrams each illustrating a semiconductor device of one embodiment of the present invention.
Figure 6B:
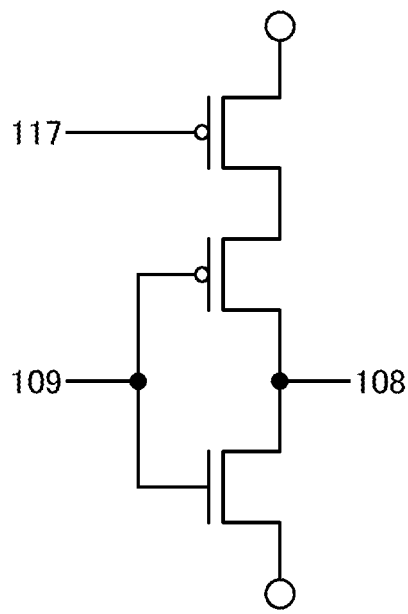
Figure 6C:
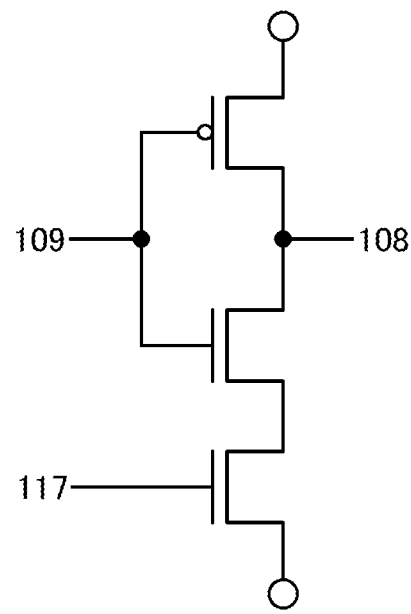

In FIG. 6A, a signal input to the second wiring 109 is input to the first wiring 108 via the inverter circuit 115 provided in the composite programming element 703. The composite programming element 703 includes the programming element 103.

A switching transistor 116 is interposed between the inverter circuit 115 and the first wiring 108, and electrical connection between the inverter circuit 115 and the first wiring 108 is controlled by a signal line 117 electrically connected to a gate electrode of the switching transistor 116.

The structure such as the composite programming element 703 illustrated in FIG. 6A enables a signal input to the first wiring 108 to be formed in the composite programming element. Therefore the programming elements do not need to be connected by the first wiring 108. Accordingly, the number of wirings can be reduced, and power consumption due to an extension of the wirings can be reduced.

Note that the switching transistor 116 may be omitted in the composite programming element 703. Further, as the inverter circuit 115, a known clocked inverter circuit or a simplified clocked inverter circuit illustrated in FIG. 6B or FIG. 6C, for example, may be used.

Note that, although one programming element 103 is included in the example in FIG. 6A in one inverter circuit 115 of the composite programming element 703, the plurality of programming elements 103 may be included.

Figure 7A:
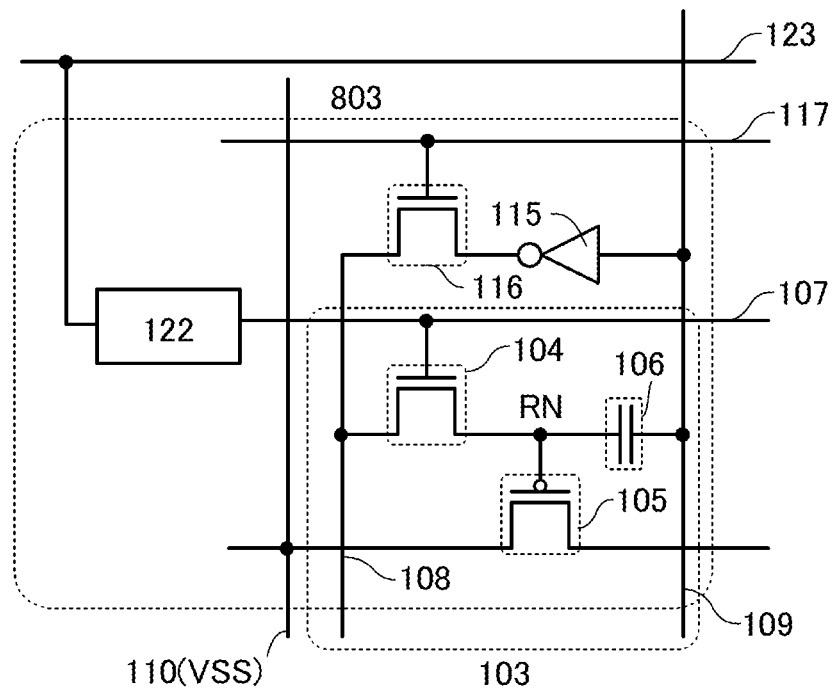
FIGS. 7A and 7B are a circuit diagram and a block diagram, respectively, of a semiconductor device of one embodiment of the present invention.

Then, FIG. 7A illustrates a configuration where the potential of the selection signal line 107 is formed in the composite programming element.

In FIG. 7A, composite programming elements 803 are connected by a signal line 123 instead of the selection signal line 107. The potential of the signal line 123 is increased to a potential needed for the selection signal line 107 by a known boosting circuit 122 and then is input to the selection signal line 107.

The signal line 123 is a wiring whose potential changes less than the potential of the selection signal line 107 does. Since the programming elements are connected by the wiring whose potential changes less than the potential of the selection signal line 107 does, influence of a voltage drop due to wiring resistance is small and power consumption can be reduced.

Note that, although one inverter circuit 115, one boosting circuit 122, and one programming element 103 are included in the composite programming element 803 in the example in FIG. 7A, the inverter circuit is not necessarily included. The composite programming element 803 may include one inverter circuit 115, one boosting circuit 122, and a plurality of programming elements 103, may include one boosting circuit 122, a plurality of inverter circuits 115, and the plurality of programming elements 103, or may include a plurality of boosting circuits 122, a plurality of inverter circuits 115, and a plurality of programming elements 103.

Figure 7B:
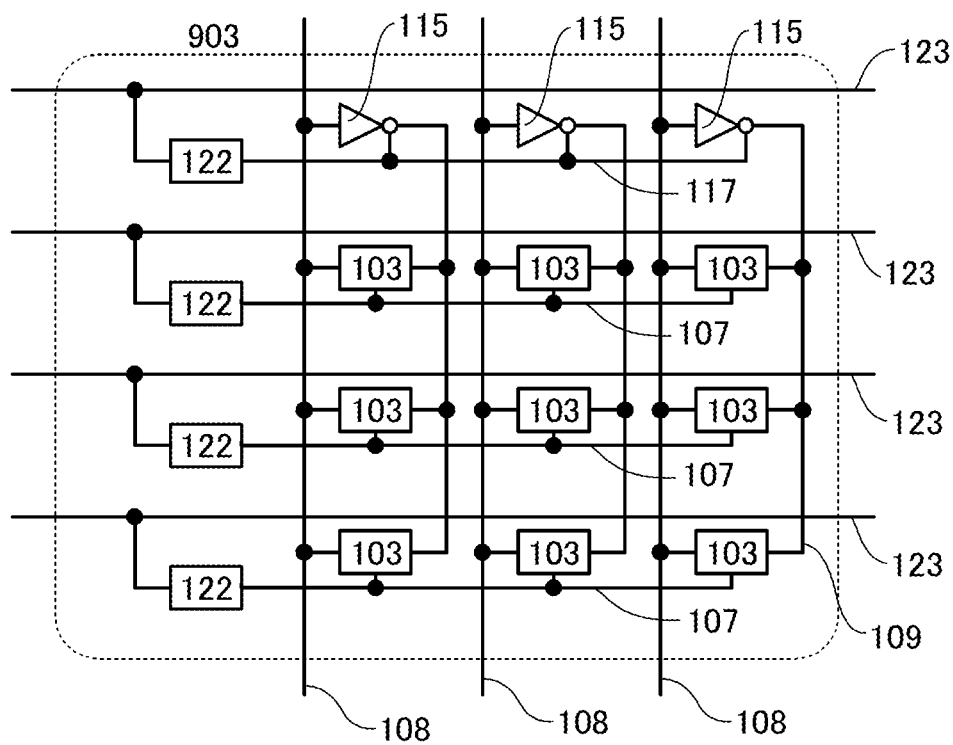

As in a composite programming element 903 illustrated in FIG. 7B, each inverter circuit 115 or each boosting circuit 122 may be provided for the plurality of programming elements 103.

In FIG. 7B, the first wiring 108 and the second wiring 109 are shared among the programming elements 103 arranged in a matrix in the column direction, and electrically connected to each other through the inverter circuit 115.

In the row direction, each signal line 123 is shared among the plurality of programming elements in the row direction. The signal line 123 is electrically connected to the boosting circuit 122, and the potential of the signal line 123 is increased to a necessary potential by a known boosting circuit 122 and then input to the selection signal line 107.

Since the inverter circuit 115, the boosting circuit 122, and the like are shared among the plurality of programming elements 103, components included in the composite programming element 903 can be reduced, which leads to higher integration.

Figure 8:
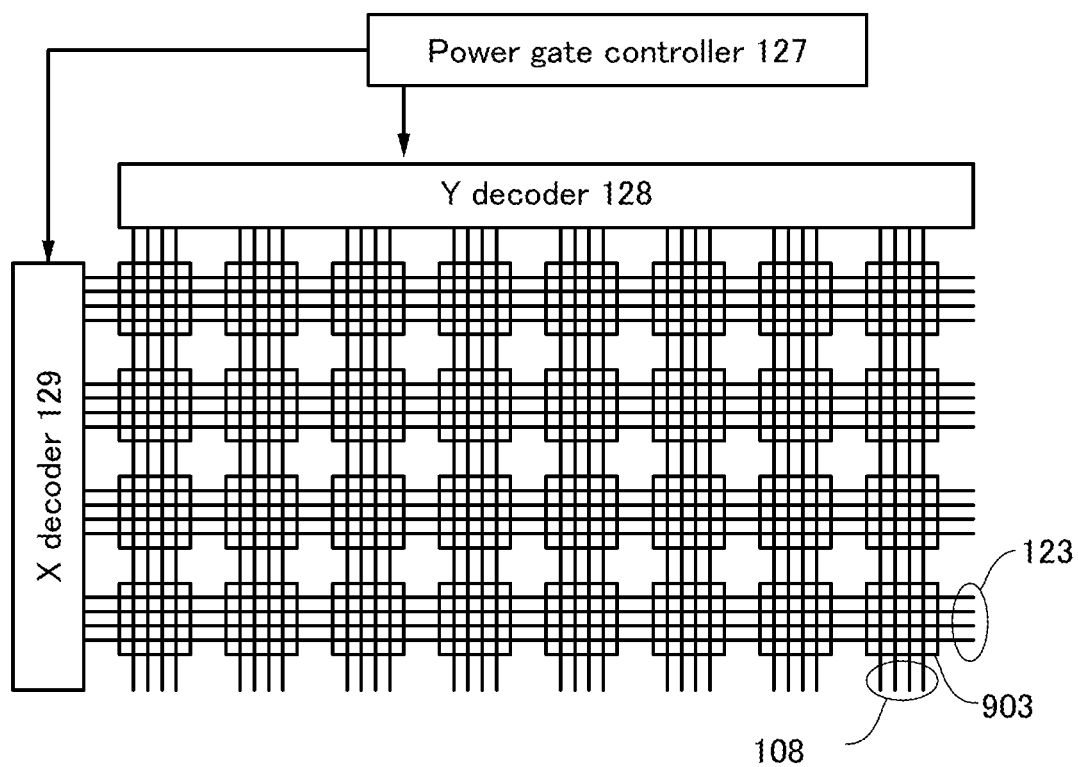
FIG. 8 is a block diagram illustrating a semiconductor device of one embodiment of the present invention.

FIG. 8 illustrates the plurality of composite programming elements 903 arranged in a matrix over a chip. In FIG. 8, one composite programming element 903 includes 16 programming elements. Over the chip, a total of 32 composite programming elements 903 are provided in a matrix of 8 columns and 4 rows. Therefore 512 programming elements are present over the chip, and accordingly, electric power supplied to 512 logic circuits 102 can be controlled.

The composite programming elements are electrically connected to each other through the plurality of first wirings 108 and the plurality of signal lines 123. Since each first wiring 108 and each signal lines 123 are shared among the plurality of composite programming elements 903, components over the chip can be reduced, which leads to higher integration.

Over the chip, a power gate controller 127, a Y decoder 128, an X decoder 129, and the like are provided. The power gate controller 127 is electrically connected to the Y decoder 128 and the X decoder 129, and performs a variety of control operations on the basis of decoded instructions from the Y decoder 128 and the X decoder 129.

In the semiconductor device of this embodiment, since programming elements which control connection between logic circuits and power supplies are provided between the logic circuits and the power supplies, electric power supply to the logic circuit that stops operation can be interrupted, so that power consumption can be reduced.

The configurations, methods, and the like described in this embodiment can be combined as appropriate with any of the configurations, methods, and the like described in the other embodiments.

Embodiment 2

In this embodiment, an example of a cross-sectional structure of the semiconductor device described in Embodiment 1 is described with reference to FIG. 9.

Figure 9:
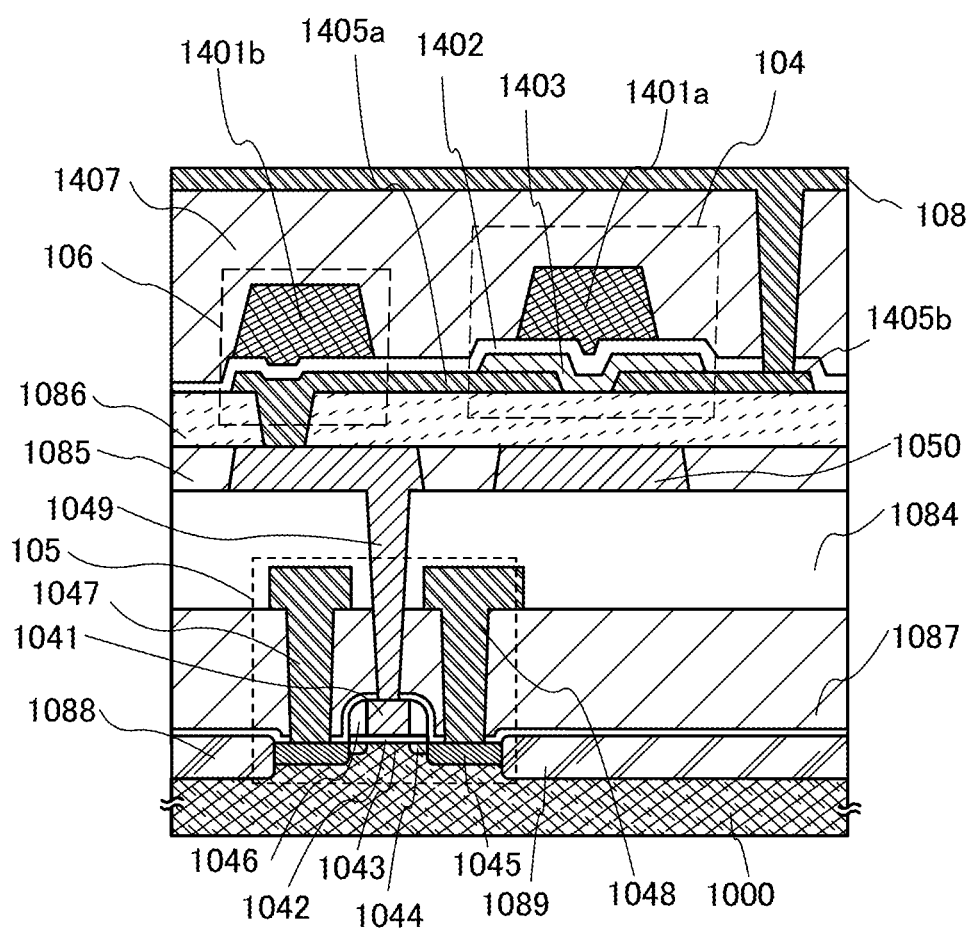
FIG. 9 is a cross-sectional view illustrating a semiconductor device of one embodiment of the present invention.

FIG. 9 illustrates an example in which the first transistor 104 overlaps the second transistor 105 and the capacitor 106 overlaps the first transistor 104. With such a planar layout, the area occupied by the semiconductor device can be reduced, which leads to higher integration.

In FIG. 9, the second transistor 105 is provided over a substrate 1000. The single crystal silicon substrate imparting n-type conductivity is used as the substrate 1000, and an impurity element imparting n-type conductivity is added to form an n-type impurity region 1044 functioning as a lightly doped drain (LDD) region or an extension region and an n-type impurity region 1045 functioning as a source region or a drain region. The second transistor 105 is an re-channel transistor and includes a channel formation region 1043, the n-type impurity region 1044, the n-type impurity region 1045 functioning as a source region or a drain region, a gate insulating film 1042, a gate electrode layer 1041, and a sidewall insulating layer 1046 covering a side surface of the gate electrode layer 1041.

The semiconductor device of one embodiment of the present invention is not limited to the structure in FIG. 9. As the second transistor 105, a transistor containing silicide or a transistor which does not include a sidewall insulating layer may be used. When a structure that contains silicide is used, resistance of the source region and the drain region can be further lowered and the speed of the semiconductor device is increased. Further, the semiconductor device can be operated at low voltage, so that power consumption of the semiconductor device can be reduced.

In the substrate 1000, the second transistor 105 is isolated from an adjacent transistor by an element isolation region 1089. An insulating film 1088 and an insulating film 1087 are stacked over the second transistor 105. Over the insulating film 1087, a source electrode layer 1047 and a drain electrode layer 1048 in contact with the n-type impurity region 1045 through openings in the insulating film 1088 and the insulating film 1087 are provided. The source electrode layer 1047 and the drain electrode layer 1048 are electrically connected to a power source and a logic circuit, respectively, which are not illustrated. In addition, over the insulating film 1087, an insulating film 1084 is provided. A wiring layer 1049 electrically connected to the gate electrode layer 1041 of the second transistor 105 through an opening provided in the insulating film 1084 is formed.

An insulating film 1085 is stacked over the insulating film 1084 and the wiring layer 1049, and over the insulating film 1085, an insulating film 1086 is stacked.

A drain electrode layer 1405a of the first transistor 104 is electrically connected to the wiring layer 1049 through an opening formed in the insulating film 1086.

In the first transistor 104, the drain electrode layer 1405a and a source electrode layer 1405b over the insulating film 1086, an oxide semiconductor film 1403 over the drain electrode layer 1405a and the source electrode layer 1405b, a gate insulating film 1402 over the oxide semiconductor film 1403, and a gate electrode layer 1401a over the gate insulating film 1402 are provided.

A conductive layer 1050 overlapping with the oxide semiconductor film 1403 is formed in the same layer as the wiring layer 1049. The conductive layer 1050 functions as a gate electrode layer of the first transistor 104.

In FIG. 9, the first transistor 104 includes two gate electrode layers above and below the oxide semiconductor film 1403. A signal for controlling an on state and an off state is supplied to one of the gate electrode layers, and the other of the gate electrode layers may be electrically insulated to be in a floating state, or may be in a state where a potential is supplied from another element. In the latter case, potentials at the same level may be supplied to the gate electrode layers, or a fixed potential such as a ground potential may be supplied only to the other of the gate electrode layers. By controlling the level of the potential supplied to the other of the gate electrode layers, the threshold voltage of the transistor can be controlled, and the off-state current or leakage current of the first transistor can further be reduced.

An electrode layer 1401b is provided over the drain electrode layer 1405a with the gate insulating film 1402 interposed therebetween. The drain electrode layer 1405a, the gate insulating film 1402, and the electrode layer 1401b form the capacitor 106. At least part of the capacitor 106 and part of the first transistor 104 overlap the second transistor 105, which leads to higher integration.

Over the first transistor 104 and the capacitor 106, an insulating film 1407 is formed. The source electrode layer 1405b of the first transistor 104 and the first wiring 108 are electrically connected to each other through an opening formed in the insulating film 1407.

Here, the oxide semiconductor film 1403 used for the first transistor 104 is described.

An oxide semiconductor used for the oxide semiconductor film 1403 is a metal oxide exhibiting semiconductor characteristics. An oxide semiconductor highly purified by reduction in the concentration of impurities such as moisture or hydrogen, which serve as electron donors (donors), is an intrinsic semiconductor or a substantially intrinsic semiconductor.

The oxide semiconductor film 1403 preferably contains at least indium (In) or zinc (Zn). In particular, In and Zn are preferably contained. As a stabilizer for reducing a variation in electrical characteristics among transistors including the oxide semiconductor, gallium (Ga) is preferably additionally contained. As the stabilizer, the oxide semiconductor film preferably contains tin (Sn), hafnium (Hf), aluminum (Al), or zirconium (Zr).

As another stabilizer, one or a plurality of kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu), may be contained.

As the oxide semiconductor film 1403, for example, any of the following can be used: a single-component metal oxide such as indium oxide, tin oxide, or zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn—O-based oxide" means an oxide containing In, Ga, and Zn as its main component and there is no particular limitation on the ratio of In to Ga and Zn. The In—Ga—Z-based oxide may contain another metal element in addition to In, Ga, and Zn.

For the oxide semiconductor film 1403, a material expressed as the chemical formula InMO$_3$(ZnO)$_m$ (m>0, m is not an integer) may be used. Note that M represents one or more metal elements selected from Ga, Fe, Mn, and Co. Alternatively, as the oxide semiconductor, a material expressed by the chemical formula In$_2$SnO$_5$(ZnO)$_n$ (n>0, n is a natural number) may be used.

For example, an In—Ga—Zn-based oxide in which the atomic ratio of In to Ga and Zn is 1:1:1, 2:2:1, or 3:2:1, or any of oxides in which the atomic ratio is in the neighborhood of the above ratios can be used. Alternatively, an In—Sn—Zn-based oxide in which the atomic ratio of In to Sn and Zn is 1:1:1, 2:1:3, or 2:1:5, or any of oxides in which the atomic ratio is in the neighborhood of the above ratios can be used.

The expression "the atomic ratio in an oxide in which the atomic ratio of In to Ga and Zn is a:b:c (a+b+c=1) is in the neighborhood of the atomic ratio in an oxide in which the atomic ratio of In to Ga and Zn is A:B:C (A+B+C=1)", for example, means that a, b, and c satisfy the following relation: $(a-A)^2+(b-B)^2+(c-C)^2 \leq r^2$, where r is 0.05, for example. The same applies to other oxides.

Without limitation to the above, the oxide semiconductor film 1403 having an appropriate atomic ratio can be used depending on necessary properties. To obtain necessary properties, the carrier concentration, the impurity element concentration, the defect density, the atomic ratio of a metal element to oxygen, the interatomic distance, the density, and the like are preferably set to appropriate values.

A structure of an oxide semiconductor film which can be used for the oxide semiconductor film 1403 is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

Further, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that in this specification, the trigonal and rhombohedral crystal systems are included in the hexagonal crystal system.

In contrast, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that, in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

It is known that irradiation with visible light or ultraviolet rays shifts the threshold voltage of a transistor using an oxide semiconductor film, which changes the electrical characteristics of the transistor. However, the change in the electrical characteristics of the transistor due to irradiation with visible light or ultraviolet light can be reduced by the use of a CAAC-OS film. Thus, a transistor with high reliability can be formed.

In the semiconductor device of this embodiment, the oxide semiconductor film 1403 which includes regions differing in crystallinity may be used. For example, a film having high crystallinity and a film having low crystallinity may be used for a region where a channel is formed and the other region, respectively. Specifically, the channel formation region can be formed using a CAAC-OS film while the other region has an amorphous structure.

Nitrogen may be substituted for part of constituent oxygen of the oxide semiconductor film 1403.

Note that for example, in the case where the oxide semiconductor film 1403 is formed using an In—Zn-based metal oxide, a target in which the atomic ratio of In to Zn is 1 to 100, preferably 1 to 20, more preferably 1 to 10. When the atomic ratio of In to Zn is in the above preferred range, field-effect mobility can be improved. Here, when the atomic ratio of In to Zn and O in the metal oxide is X:Y:Z, the following relation is preferable so that excess oxygen is contained: Z>1.5X+Y.

In the case where the oxide semiconductor film 1403 is formed using an In—Ga—Zn-based oxide by a sputtering method, it is preferable to use an In—Ga—Zn-based oxide target in which the atomic ratio of In to Ga and Zn is 1:1:1, 4:2:3, 3:1:2, 1:1:2, 2:1:3, or 3:1:4. When the oxide semiconductor film 1403 is formed using an In—Ga—Zn oxide target having such an atomic ratio, a polycrystalline film or a CAAC-OS film is easily formed.

In the case where the oxide semiconductor film 1403 is formed using an In—Sn—Zn-based oxide by a sputtering method, it is preferable to use an In—Sn—Zn—O target in which the atomic ratio of In to Sn and Zn is 1:1:1, 2:1:3, 1:2:2, or 4:9:7. When an oxide semiconductor film 1403 is formed using an In—Sn—Zn oxide target having such an atomic ratio, a polycrystalline film or a CAAC-OS film is easily formed.

Note that the relative density of the target is greater than or equal to 90% and less than or equal to 100%, preferably greater than or equal to 95% and less than or equal to 100%. With a high filling factor, a dense oxide semiconductor film can be formed.

Note that the energy gap of a metal oxide which can be applied to the oxide semiconductor film 1403 is preferably greater than or equal to 2 eV, more preferably greater than or equal to 2.5 eV, still more preferably greater than or equal to 3 eV. With use of a metal oxide having such a wide band gap, the off-state current of a transistor can be reduced. For example, the off-state current per micrometer of channel width of the transistor can be less than or equal to $1 \times 10^{-19}$ A, preferably less than or equal to $1 \times 10^{-20}$ A, more preferably less than or equal to $1 \times 10^{-22}$ A.

Further, the oxide semiconductor film 1403 may have a structure in which a plurality of oxide semiconductor films is stacked. For example, the oxide semiconductor film may have a stacked layer structure of a first oxide semiconductor film and a second oxide semiconductor film which are formed using metal oxides with different atomic ratios. For example, the first oxide semiconductor film may be formed using a three-component metal oxide while the second oxide semiconductor film is formed using a two-component metal oxide. Alternatively, for example, both the first oxide semiconductor film and the second oxide semiconductor film may be formed using a three-component metal oxide.

Further, the constituent elements of the first oxide semiconductor film and the second oxide semiconductor film may be the same while the atomic ratios of the constituent elements of the first oxide semiconductor film and the second oxide semiconductor film are be different. For example, the atomic ratio of In to Ga and Zn in the first oxide semiconductor film may be 1:1:1 while the atomic ratio of In to Ga and Zn in the second oxide semiconductor film is 3:1:2. Alternatively, the atomic ratio of In to Ga and Zn in the first oxide semiconductor film may be 1:3:2 while the atomic ratio of In to Ga and Zn in the second oxide semiconductor film is 2:1:3.

In this case, in one of the first oxide semiconductor film and the second oxide semiconductor film, which is closer to the gate electrode (gate electrode to which the signal for controlling an on state and an off state is supplied) (i.e., the oxide semiconductor film on the channel side), the atomic ratio of In to Ga is preferably as follows: In>Ga. In the other oxide semiconductor film, which is farther from the gate electrode (i.e., the oxide semiconductor film on the back channel side), the atomic ratio of In to Ga is preferably as follows: In≤Ga.

In an oxide semiconductor, the s orbits of heavy metal mainly contributes to carrier transfer, and when the atomic ratio of In to Ga is increased, overlaps of the s orbit are likely to be increased. Therefore, an oxide in which In>Ga has higher mobility than an oxide in which In≤Ga. Further, in Ga, the formation energy of an oxygen vacancy is larger and thus an oxygen vacancy is less likely to occur than in In; therefore, the oxide in which In≤Ga has more stable characteristics than the oxide in which In>Ga.

An oxide semiconductor in which In>Ga is used on the channel side and an oxide semiconductor in which In≤Ga is used on the back channel side, whereby the field-effect mobility and reliability of the transistor can be further improved.

Further, oxide semiconductors having different crystallinities may be used for the first oxide semiconductor film and the second oxide semiconductor film. That is, the oxide semiconductor film may be formed by using any of a single crystal oxide semiconductor, a polycrystalline oxide semiconductor, an amorphous oxide semiconductor, and a CAAC-OS film, as appropriate. When an amorphous oxide semiconductor is used for at least one of the first oxide semiconductor film and the second oxide semiconductor film, internal stress or external stress of the oxide semiconductor film is relieved, a variation in characteristics among transistors is reduced, and reliability of the transistors can be further improved.

An amorphous oxide semiconductor is likely to incorporate impurities, such as hydrogen which serves as donors, and to generate an oxygen vacancy and thus easily becomes an n-type. Therefore the oxide semiconductor film on the channel side is preferably formed using an oxide semiconductor having crystallinity such as a CAAC-OS film.

The oxide semiconductor film 1403 may have a stacked layer structure including three or more layers in which an amorphous oxide semiconductor film is interposed between a plurality of oxide semiconductor films having crystallinity or a structure in which an oxide semiconductor film having crystallinity and an amorphous oxide semiconductor film are alternately stacked may be employed.

The above structures for making the oxide semiconductor film 1403 have a stacked layer structure of a plurality of layers can be combined as appropriate.

Note that the concentrations of an alkali metal and an alkaline earth metal in the oxide semiconductor film 1403 are preferably low and specifically preferably $1 \times 10^{18}$ atoms/cm$^3$ or less, more preferably $2 \times 10^{16}$ atoms/cm$^3$ or lower. When an alkali metal and an alkaline earth metal are bonded to an oxide semiconductor, carriers may be generated, which causes an increase in the off-state current of the transistor.

The oxide semiconductor film 1403 is preferably formed by a sputtering method in an oxygen gas atmosphere at a substrate heating temperature in the range of 100° C. to 600° C., preferably 150° C. to 550° C., and more preferably 200° C. to 500° C. The impurity element concentration in the obtained oxide semiconductor layer is decreased with an increase in the substrate heating temperature in the film formation. Further, the atomic arrangement in the oxide semiconductor film is ordered and the density thereof is increased, so that a polycrystalline film or a CAAC-OS film can easily be formed.

Furthermore, when an oxygen gas atmosphere is employed for the film formation, an unnecessary atom such as a rare gas atom is not contained in the oxide semiconductor film, so that a polycrystalline oxide semiconductor film or a CAAC-OS film can easily be formed. Note that a mixed gas atmosphere including an oxygen gas and a rare gas such as an argon gas may be used. In that case, the percentage of an oxygen gas is higher than or equal to 30 vol. %, preferably higher than or equal to 50 vol. %, more preferably higher than or equal to 80 vol. %. It is preferable that argon and oxygen used for the formation of the oxide semiconductor film do not contain water, hydrogen, or the like. For example, it is preferable that argon have a purity of 9N or more, a dew point of −121° C. or less, a water content of 0.1 ppb or more, and a hydrogen content of 0.5 ppb or more and oxygen have a purity of 8N or more, a dew point of −112° C. or less, a water content of 1 ppb or less, and a hydrogen content of 1 ppb or less.

When the oxide semiconductor film 1403 has crystallinity, it has fewer defects in the bulk than an oxide semiconductor film in an amorphous state; therefore, improvement of the surface flatness can achieve carrier mobility higher than that of an oxide semiconductor film in an amorphous state. In order to improve the surface flatness, the oxide semiconductor film 1403 is preferably formed on a flat surface. Specifically, the oxide semiconductor film 1403 is preferably formed on a surface with an average surface roughness (Ra) less than or equal to 1 nm, preferably less than or equal to 0.3 nm, more preferably less than or equal to 0.1 nm.

Note that $R_a$ is obtained by expanding, into three dimensions, the arithmetic mean surface roughness defined by JIS B 0601: 2001 (ISO4287: 1997) so that it can be applied to a curved surface, and $R_a$ can be expressed as an "average value of the absolute values of deviations from a reference surface to a specific surface" and is defined by the following formula.

$$Ra = \frac{1}{S_0}\int_{y_1}^{y_2}\int_{x_1}^{x_2}|f(x, y) - Z_0|\,dx\,dy \quad \text{[FORMULA 1]}$$

Here, the designated surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. The area of a rectangle which is obtained by projecting the specific surface on the xy plane is represented by $S_0$, and the height of the reference surface (the average height of the specific surface) is represented by $Z_0$. Note that Ra can be measured with an atomic force microscope (AFM).

To planarize a surface of the insulating film 1086 where the oxide semiconductor film 1403 is formed, the oxide semiconductor film 1403 may be formed after the insulating film 1086 is subjected to planarization treatment.

As the planarization treatment, for example, polishing treatment (such as a chemical mechanical polishing (CMP) method), dry etching treatment, plasma treatment, or the like can be used.

Further, it is preferable that hydrogen contained in the oxide semiconductor film 1403 be as little as possible. As hydrogen, a hydrogen atom, a hydrogen molecule, water, a hydroxyl group, or hydride may be contained in the oxide semiconductor film. Thus, heat treatment for removing excess hydrogen (including water and a hydroxyl group) in the oxide semiconductor film (dehydration or dehydrogenation) is preferably performed. The temperature of the heat treatment is higher than or equal to 300° C. and lower than or equal to 700° C., or lower than the strain point of the substrate. The heat treatment can be performed in a reduced-pressure atmosphere, an inert atmosphere, or the like. Note that the heat treatment may be performed before the formed oxide semiconductor film is processed into an island-like shape or after the oxide semiconductor film is processed into an island-like shape. Further, the heat treatment for the dehydration or dehydrogenation may be performed more than once, and may also serve as another heat treatment.

The heat treatment is preferably performed in such a manner that after heat treatment is performed in a reduced-pressure atmosphere or an inert atmosphere, the atmosphere is switched to an oxidation atmosphere with the temperature maintained and heat treatment is further performed. When the heat treatment is performed in a reduced-pressure atmosphere or an inert atmosphere, the concentration of an impurity (e.g., hydrogen) in the oxide semiconductor film 1403 can be reduced; however, oxygen vacancies might be caused at the same time. By the heat treatment in the oxidation atmosphere, the caused oxygen vacancies can be reduced.

An insulating film (e.g., the insulating film 1086 or the gate insulating film 1402), which is in contact with the oxide semiconductor film 1403, preferably contains oxygen the amount of which exceeds at least that of oxygen in the stoichiometric composition in the film (the bulk). For example, in the case where a silicon oxide layer is used as the insulating film, $SiO_{(2+\alpha)}$ ($\alpha>0$) is employed.

As the insulating film, an oxide insulating film formed using silicon oxide, gallium oxide, aluminum oxide, silicon oxynitride, silicon nitride oxide, hafnium oxide, tantalum oxide, or the like is preferably used. Further, the insulating film can be formed as a single layer structure or a stacked layer structure including two or more layers with the use of these compounds. In the case of a stacked layer structure, a silicon oxide film formed by a sputtering method as an insulating film in contact with the oxide semiconductor film and, on the side of the insulating film opposite to the side in contact with the oxide semiconductor film, an insulating film such as a silicon oxide film formed by a CVD method may be used. By using an oxide insulating film in which the concentration of hydrogen is reduced as the insulating film in contact with the oxide insulating film, diffusion of hydrogen in the oxide semiconductor film is suppressed, and in addition, oxygen is supplied from the oxide insulating film to oxygen defects in the oxide semiconductor film. Thus, electrical characteristics of the transistor can be improved.

As the insulating film in contact with the oxide insulating film, an oxide insulating layer containing at least one of metal elements selected from constituent elements of the oxide semiconductor film may be used. For example, an oxide insulating layer containing gallium may be used. Examples of such an oxide insulating film include a gallium oxide film (also referred to as $GaO_x$; x is not necessarily a natural number but includes a non-natural number), a gallium zinc oxide film (also referred to as $Ga_2Zn_xO_y$, (x=1 to 5); x or y is not necessarily a natural number but includes a non-natural number), a $Ga_2O_3(Gd_2O_3)$ film, and an insulating In—Ga—Zn-based oxide film in which the gallium content is high and the indium content is low.

In the semiconductor device of this embodiment, since the programming element includes the first transistor whose off-state current or leakage current is sufficiently reduced, even when electric power supply to the programming element is interrupted, a connection state between the logic circuit and the power source can be held, which leads to a reduction in power consumption.

In the semiconductor device of this embodiment, a node is formed using the drain electrode of the first transistor whose off-state current or leakage current is sufficiently reduced, the gate electrode of the second transistor, and one of electrodes of the capacitor. After charge is accumulated in the node through the first transistor, the node is placed into a floating state and the potential of the node is increased using capacitive coupling of the capacitor. Hence, the potential of the node can be changed more greatly than the potential for driving. Thus, the change in the potentials supplied to the wirings can be small, so that power consumption can be reduced.

The methods and structures described in this embodiment can be combined as appropriate with any of the methods and structures described in the other embodiments.

Embodiment 3

In this embodiment, a configuration of a CPU, which is a semiconductor device according to one embodiment of the present invention is described.

Figure 10:
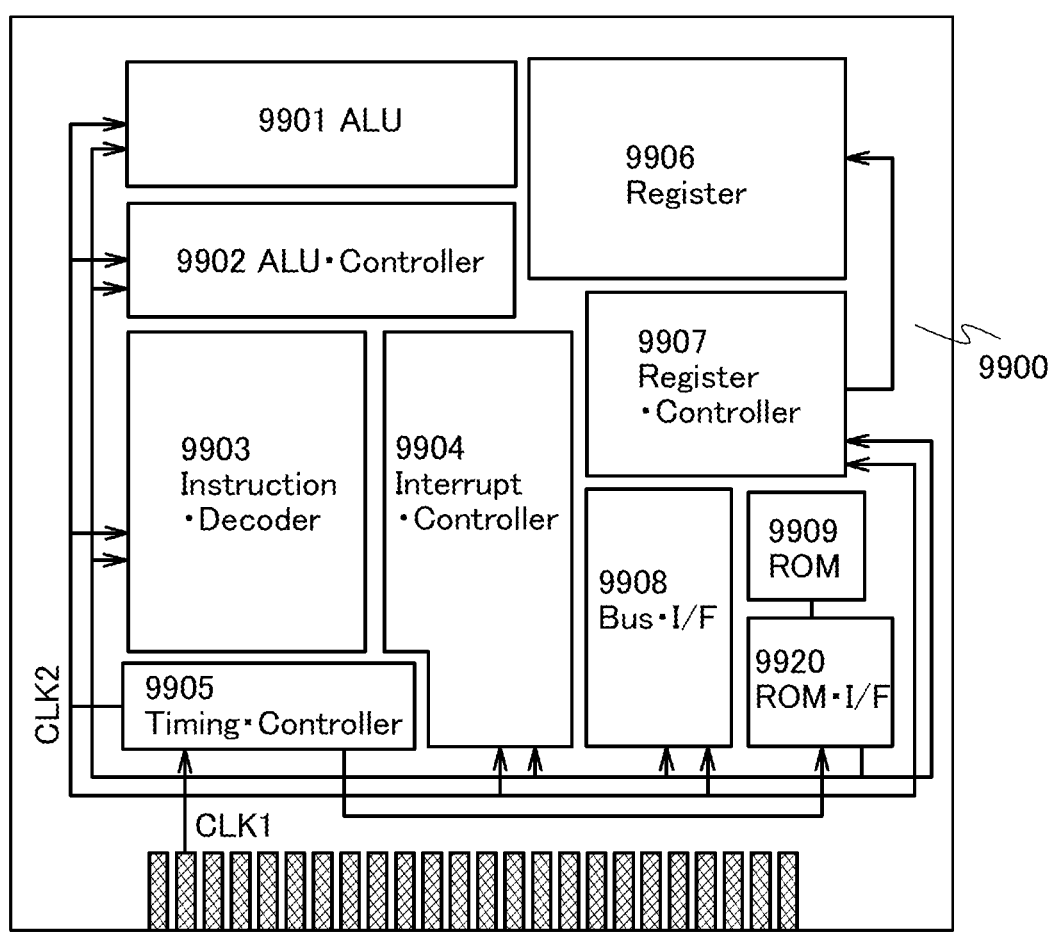
FIG. 10 illustrates a CPU which is a semiconductor device of one embodiment of the present invention.

FIG. 10 illustrates a configuration of the CPU of this embodiment. The CPU in FIG. 10 mainly includes an ALU 9901, an ALU controller 9902, an instruction decoder 9903, an interrupt controller 9904, a timing controller 9905, a register 9906, a register controller 9907, a bus I/F 9908, a rewritable ROM 9909, and a ROM I/F 9920, over a substrate 9900. Note that "ALU" means "arithmetic logic unit", the "bus I/F" means "bus interface", and the "ROM I/F" means "ROM interface". The ROM 9909 and the ROM I/F 9920 may be provided over another chip. Obviously, the CPU illustrated in FIG. 10 is just an example in which the structure is simplified, and an actual CPU may have various structures depending on the application.

An instruction which is input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the drive of the ALU 9901. While the CPU is executing a program, the interrupt controller 9904 processes an interrupt request from an external input/output device or a peripheral circuit based on its priority or a mask state. The register controller 9907 generates an address of the register 9906, and reads/writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and inputs the clock signal CLK2 to the above circuits.

In response to an instruction from the ALU 9901, the register controller 9907 can stop the supply of power supply voltage in a semiconductor storage device of the register 9906 without the necessity of saving and returning a data signal.

In such a manner, even in the case where the operation of the CPU is temporarily stopped and the supply of the power supply voltage is stopped, a data signal can be held and power consumption can be reduced. Specifically, for example, while a user of a personal computer does not input data to an input device such as a keyboard, the operation of the CPU can be stopped, which leads to a reduction in power consumption.

Although the example of the CPU is described in this embodiment, the signal processing circuit of the present invention is not limited to the CPU and can be applied to an LSI such as a microprocessor, an image processing circuit, a DSP, or a FPGA.

By using the semiconductor device described in Embodiment 1 for the CPU described in this embodiment, power consumption of the CPU can be reduced.

The configurations, methods, and the like described in this embodiment can be combined as appropriate with any of the configurations, methods, and the like described in the other embodiments.

Embodiment 4

The semiconductor device disclosed in this specification can be applied to a variety of electronic devices. Examples of electronic devices are television sets (also referred to as televisions or television receivers), monitors of computers and the like, digital cameras, digital video cameras, digital photo frames, mobile phones, portable game machines, portable information terminals, audio reproducing devices, game machines (e.g., pachinko machines or slot machines), and housings of game machines.

Figure 11A:
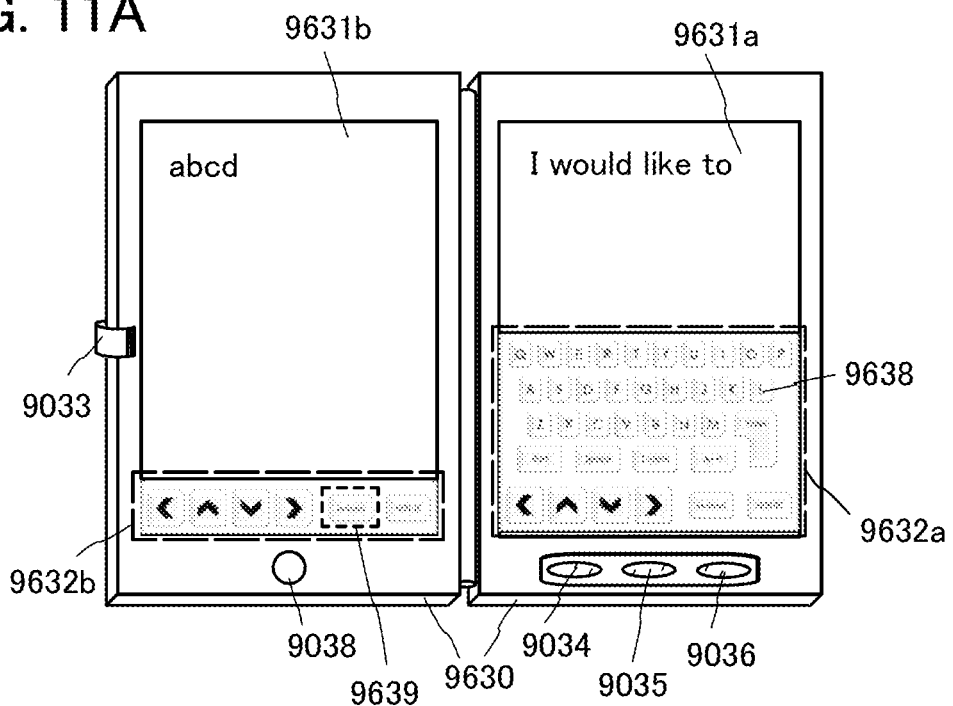
FIGS. 11A to 11C illustrate an electronic device to which a semiconductor device of one embodiment of the present invention can be applied.
Figure 11B:
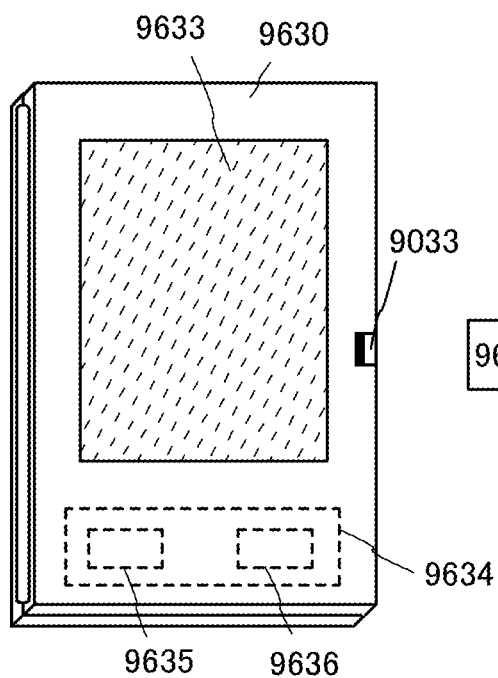
Figure 11C:
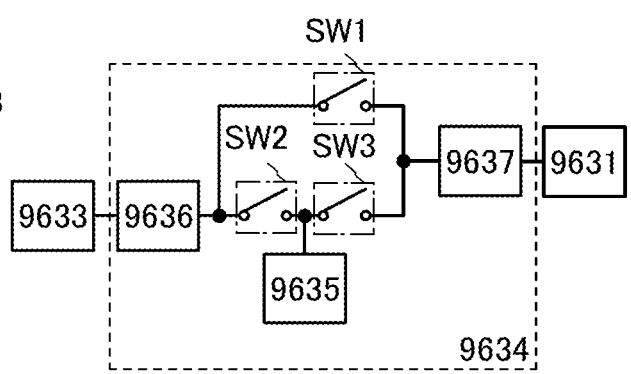

FIGS. 11A to 11C illustrate a specific example of an electronic device. FIGS. 11A and 11B illustrate a foldable tablet terminal In FIG. 11A, the tablet terminal is opened, and includes a housing 9630, a display portion 9631a, a display portion 9631b, a display-mode switch 9034, a power button 9035, a power-saving-mode switch 9036, a clip 9033, and an operation button 9038.

Part of the display portion 9631a can be a touch panel region 9632a, and data can be input by touching operation keys 9638 that are displayed. Note that FIG. 11A shows, as an example, that half of the area of the display portion 9631a has only a display function and the other half of the area has a touch panel function. However, the structure of the display portion 9631a is not limited to this. All the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9034 for switching display modes can switch display orientation (e.g., between landscape mode and portrait mode) and select a display mode (switch between monochrome display and color display), for example. With the switch 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for detecting orientation (e.g., a gyroscope or an acceleration sensor) in addition to the optical sensor.

Although the display portion 9631a and the display portion 9631b have the same display area in FIG. 11A, one embodiment of the present invention is not limited to this example. They may differ in size and/or image quality. For example, one of them may be a display panel that can display higher-definition images than the other.

FIG. 11B illustrates the tablet terminal folded, which includes the housing 9630, a solar battery 9633, a charge and discharge control circuit 9634, a battery 9635, and a DCDC converter 9636. Note that FIG. 11B shows an example in which the charge and discharge control circuit 9634 includes the battery 9635 and the DCDC converter 9636.

Since the tablet can be folded in two, the housing 9630 can be closed when the tablet is not in use. Thus, the display portions 9631a and 9631b can be protected, thereby providing a tablet with high endurance and high reliability for long-term use.

The tablet terminal illustrated in FIGS. 11A and 11B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar battery 9633, which is attached on the surface of the tablet terminal, supplies electric power to a touch panel, a display portion, an image signal processor, and the like. Provision of the solar battery 9633 is preferable in that the battery 9635 can be charged efficiently for one or two surfaces of the housing 9630. When a lithium ion battery is used as the battery 9635, there is an advantage of downsizing or the like.

The structure and operation of the charge and discharge control circuit 9634 illustrated in FIG. 11B are described with reference to a block diagram of FIG. 11C. FIG. 11C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 11B.

First, an example of operation in the case where power is generated by the solar battery 9633 using external light is described. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Note that the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

By using the semiconductor device described in Embodiment 1 for the electronic devices described in this embodiment, power consumption of the electronic devices can be reduced.

The configurations, methods, and the like described in this embodiment can be combined as appropriate with any of the configurations, methods, and the like described in the other embodiments.

This application is based on Japanese Patent Application serial No. 2012-104477 filed with the Japan Patent Office on May 1, 2012, the entire contents of which are hereby incorporated by reference.

What is claimed is:

1. A semiconductor device comprising:
a controller;
a decoder;
a logic circuit; and
a programming element comprising a first transistor, a second transistor and a capacitor,
wherein the programming element is configured to control an electric power supply to the logic circuit,
wherein the controller is electrically connected to the decoder,
wherein the decoder is electrically connected to the programming element via a first wiring,
wherein one of a source and a drain of the first transistor is electrically connected to the first wiring,
wherein the other of the source and the drain of the first transistor is electrically connected to a gate of the second transistor,
wherein a first electrode of the capacitor is electrically connected to the gate of the second transistor, and
wherein a second electrode of the capacitor is electrically connected to a second wiring.

2. The semiconductor device according to claim 1, wherein the first transistor comprises an oxide semiconductor in a channel formation region.

3. The semiconductor device according to claim 1, wherein the second transistor comprises silicon in a channel formation region.

4. The semiconductor device according to claim 1,
wherein a voltage is applied between the first electrode and the second electrode of the capacitor while a first potential is supplied to the second electrode of the capacitor, and
wherein a second potential is supplied to the second electrode of the capacitor while the gate of the second transistor is in floating.

5. The semiconductor device according to claim 4, wherein the first potential and the second potential are supplied from an inverter circuit to the second electrode of the capacitor.

6. The semiconductor device according to claim 4, wherein the voltage is applied between the first electrode and the second electrode of the capacitor by supplying a third potential to the first wiring and supplying the first potential to the second wiring while keeping the first transistor in an on-state.

7. A semiconductor device comprising:
a controller;
a decoder;
a plurality of logic circuits; and
a plurality of programming elements, each of the plurality of programming elements comprising a first transistor, a second transistor and a capacitor,
wherein each of the plurality of programming elements is configured to control an electric power supply to one of the plurality of logic circuits,
wherein the controller is electrically connected to the decoder,
wherein the decoder is electrically connected to one of the plurality of programming elements via a first wiring,
wherein one of a source and a drain of the first transistor is electrically connected to the first wiring,
wherein the other of the source and the drain of the first transistor is electrically connected to a gate of the second transistor,
wherein a first electrode of the capacitor is electrically connected to the gate of the second transistor, and
wherein a second electrode of the capacitor is electrically connected to a second wiring.

8. The semiconductor device according to claim 7, wherein the first transistor comprises an oxide semiconductor in a channel formation region.

9. The semiconductor device according to claim 7, wherein the second transistor comprises silicon in a channel formation region.

10. The semiconductor device according to claim 7,
wherein a voltage is applied between the first electrode and the second electrode of the capacitor while a first potential is supplied to the second electrode of the capacitor, and wherein a second potential is supplied to the second electrode of the capacitor while the gate of the second transistor is in floating.

11. The semiconductor device according to claim 10, wherein the first potential and the second potential are supplied from an inverter circuit to the second electrode of the capacitor.

12. The semiconductor device according to claim 10, wherein the voltage is applied between the first electrode and the second electrode of the capacitor by supplying a third potential to the first wiring and supplying the first potential to the second wiring while keeping the first transistor in an on-state.

13. An electronic device comprising:
a controller;
a decoder;
a logic circuit; and
a programming element comprising a first transistor, a second transistor and a capacitor,
wherein the programming element is configured to control an electric power supply to the logic circuit,
wherein the controller is electrically connected to the decoder,
wherein the decoder is electrically connected to the programming element via a first wiring,
wherein one of a source and a drain of the first transistor is electrically connected to the first wiring,
wherein the other of the source and the drain of the first transistor is electrically connected to a gate of the second transistor,
wherein a first electrode of the capacitor is electrically connected to the gate of the second transistor, and
wherein a second electrode of the capacitor is electrically connected to a second wiring.

14. The electronic device according to claim 13, wherein the first transistor comprises an oxide semiconductor in a channel formation region.

15. The electronic device according to claim 13, wherein the second transistor comprises silicon in a channel formation region.

16. The electronic device according to claim 13,
wherein a voltage is applied between the first electrode and the second electrode of the capacitor while a first potential is supplied to the second electrode of the capacitor, and
wherein a second potential is supplied to the second electrode of the capacitor while the gate of the second transistor is in floating.

17. The electronic device according to claim 16, wherein the first potential and the second potential are supplied from an inverter circuit to the second electrode of the capacitor.

18. The electronic device according to claim 16, wherein the voltage is applied between the first electrode and the second electrode of the capacitor by supplying a third potential to the first wiring and supplying the first potential to the second wiring while keeping the first transistor in an on-state.

19. A semiconductor device comprising:
a first logic circuit;
a second logic circuit;
a first programming element comprising a first transistor, a second transistor and a first capacitor; and
a second programming element comprising a third transistor, a fourth transistor and a second capacitor,
wherein the first programming element is configured to control an electric power supply to the first logic circuit,
wherein one of a source and a drain of the first transistor is directly connected to a first wiring,
wherein the other of the source and the drain of the first transistor is directly connected to a gate of the second transistor,
wherein a first electrode of the first capacitor is electrically connected to the gate of the second transistor,
wherein a second electrode of the first capacitor is electrically connected to a second wiring,
wherein the second programming element is configured to control an electric power supply to the second logic circuit,
wherein one of a source and a drain of the third transistor is directly connected to the first wiring,
wherein the other of the source and the drain of the third transistor is directly connected to a gate of the fourth transistor,
wherein a first electrode of the second capacitor is electrically connected to the gate of the fourth transistor, and
wherein a second electrode of the second capacitor is electrically connected to the second wiring.

20. The semiconductor device according to claim 19, wherein the first transistor comprises an oxide semiconductor in a channel formation region.

21. The semiconductor device according to claim 20, wherein the second transistor comprises silicon in a channel formation region.

* * * * *